(12) United States Patent
Kwisnek et al.

(10) Patent No.: US 10,400,057 B2
(45) Date of Patent: *Sep. 3, 2019

(54) LIQUID, HYBRID UV/VIS RADIATION CURABLE RESIN COMPOSITIONS FOR ADDITIVE FABRICATION

(71) Applicant: DSM IP ASSETS B.V., Te Heerlen (NL)

(72) Inventors: Luke Kwisnek, Elgin, IL (US); Tai Yeon Lee, Crystal Lake, IL (US); Johan Franz Gradus Antonius Jansen, Echt (NL); Betty Coussens, Echt (NL); Kangtai Ren, Geneva, IL (US)

(73) Assignee: DSM IP Assets B.V., Te Heerlen (NL)

(*) Notice: Subject to any disclaimer, the term of this patent is extended or adjusted under 35 U.S.C. 154(b) by 0 days.

This patent is subject to a terminal disclaimer.

(21) Appl. No.: 15/618,154

(22) Filed: Jun. 9, 2017

(65) Prior Publication Data

US 2017/0275414 A1  Sep. 28, 2017

Related U.S. Application Data

(63) Continuation of application No. 15/281,978, filed on Sep. 30, 2016, now Pat. No. 9,708,442.

(Continued)

(51) Int. Cl.
 *C08G 59/22* (2006.01)
 *B33Y 10/00* (2015.01)
 (Continued)

(52) U.S. Cl.
 CPC ........... *C08G 59/226* (2013.01); *B33Y 10/00* (2014.12); *C08G 59/24* (2013.01); *C08G 59/245* (2013.01);
 (Continued)

(58) Field of Classification Search
 CPC .... C08G 59/226; C08G 59/24; C08G 59/245; C08G 59/68; B33Y 10/00; B33Y 70/00;
 (Continued)

(56) References Cited

U.S. PATENT DOCUMENTS

| 4,962,992 A | 10/1990 | Chapin et al. |
| 5,104,433 A | 4/1992 | Chapin et al. |

(Continued)

FOREIGN PATENT DOCUMENTS

| EP | 1905415 B1 | 4/2008 |
| EP | 2502728 B1 | 1/2017 |

(Continued)

OTHER PUBLICATIONS

Ciba Irgacure 184 Photoinitiator, Ciba Specialty Chemicals, Coating Effects Segment, 2001, pp. 1-3, Edition 4.9 Basle.

(Continued)

*Primary Examiner* — Sanza L. McClendon
(74) *Attorney, Agent, or Firm* — Daniel S. Bujas; Kevin M. Bull

(57) ABSTRACT

Described herein are thermoset compositions suitable for hybrid polymerization when processed via additive fabrication equipment utilizing sources of actinic radiation with peak spectral intensities in the UV and/or visible region containing a photoinitiating package, a cationically curable constituent, a free-radically curable component, and optionally, one or more additives. Such thermoset compositions preferably contain a Norrish Type I photoinitiator that is an alkyl-, aryl-, or acyl-substituted compound centered around a Group 14 atom, and further possesses specified ranges of ionization potential values with respect to its known triplet state. Also disclosed are methods of creating three-dimensional parts via additive fabrication processes utilizing sources of actinic radiation with peak spectral intensities in the UV and/or visible regions employing the claimed thermosetting compositions, along with the parts cured therefrom.

20 Claims, 1 Drawing Sheet

Time

Related U.S. Application Data

(60) Provisional application No. 62/235,608, filed on Oct. 1, 2015.

(51) Int. Cl.

| | | |
|---|---|---|
| *C08G 59/24* | (2006.01) | |
| *C08G 59/68* | (2006.01) | |
| *G03F 7/004* | (2006.01) | |
| *G03F 7/029* | (2006.01) | |
| *G03F 7/038* | (2006.01) | |
| *B33Y 70/00* | (2015.01) | |
| *B29C 64/135* | (2017.01) | |

(52) U.S. Cl.
CPC ........... *C08G 59/68* (2013.01); *G03F 7/0045* (2013.01); *G03F 7/029* (2013.01); *G03F 7/038* (2013.01); *B29C 64/135* (2017.08); *B33Y 70/00* (2014.12)

(58) Field of Classification Search
CPC ....... B29C 64/35; G03F 7/0045; G03F 7/029; G03F 7/0038
See application file for complete search history.

(56) References Cited

U.S. PATENT DOCUMENTS

| | | | |
|---|---|---|---|
| 6,127,092 A | 10/2000 | Schon et al. | |
| 6,368,769 B1 | 4/2002 | Ohkawa | |
| 6,531,522 B1 | 3/2003 | Winningham | |
| 6,539,152 B1 | 3/2003 | Fewkes | |
| 6,563,996 B1 | 5/2003 | Winningham | |
| 6,610,759 B1 | 8/2003 | Chappelow | |
| 6,689,463 B2 | 2/2004 | Chou | |
| 6,775,451 B1 | 8/2004 | Botelho | |
| 6,869,981 B2 | 3/2005 | Fewkes | |
| 7,010,206 B1 | 3/2006 | Baker et al. | |
| 7,221,842 B2 | 5/2007 | Baker et al. | |
| 7,423,105 B2 | 9/2008 | Winningham | |
| 7,605,190 B2 | 10/2009 | Moszner et al. | |
| 7,696,260 B2 * | 4/2010 | Ren ....................... | G03F 7/0037 252/186.1 |
| 8,829,067 B2 | 9/2014 | Moszner | |
| 2007/0100039 A1 | 5/2007 | Hancock, Jr. | |
| 2010/0068407 A1 | 3/2010 | Jeremic | |
| 2010/0227941 A1 | 9/2010 | Kurosawa | |
| 2010/0304088 A1 | 12/2010 | Steeman | |
| 2011/0104500 A1 | 5/2011 | Southwell | |
| 2015/0044623 A1 | 2/2015 | Rundlett | |
| 2015/0099127 A1 | 4/2015 | Ogawa et al. | |

FOREIGN PATENT DOCUMENTS

| | | |
|---|---|---|
| EP | 2137576 B1 | 8/2018 |
| WO | WO2011075555 | 6/2011 |
| WO | WO2014109303 | 7/2014 |
| WO | WO2014109303 A1 | 7/2014 |
| WO | 2017055209 | 4/2017 |

OTHER PUBLICATIONS

Ciba Irgacure 2959 Photoinitiator, Ciba Specialty Chemicals, Coating Effects Segment, Edition 2.4, 98, pp. 1-3, Basle.

Dursun et al., Free Radical Promoted Cationic Polymerization by Using Bisacylphosphine Oxide Photoinitiators: substituent effect on the reactivity of Phosphinoyl radicals, Polymer, 2003, 7389-7396, 44.

Yagci et al. "Visible Light Initiated Free Radical Promoted Cationic Polymerization Using Acylgermane Based Photoinitiator in the Presence of Onium Salts." Macromolecules, 2008, 41, 6714-6718.

* cited by examiner

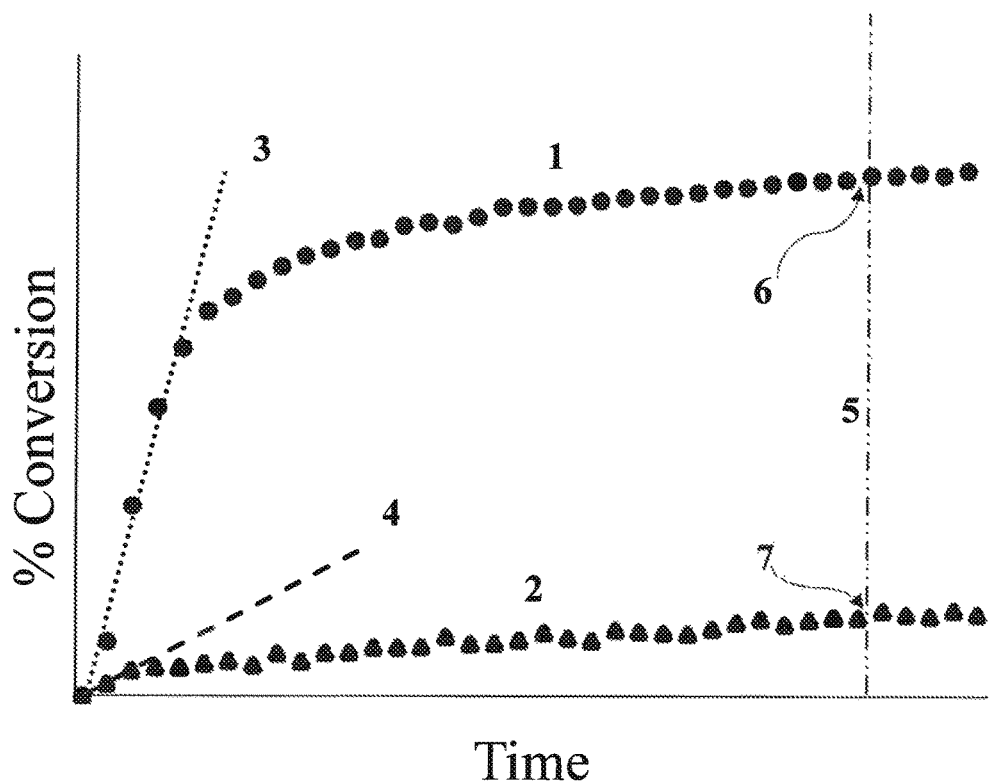

LIQUID, HYBRID UV/VIS RADIATION CURABLE RESIN COMPOSITIONS FOR ADDITIVE FABRICATION

CROSS-REFERENCE TO RELATED APPLICATION

This application is a continuation of U.S. patent application Ser. No. 15/281,978, filed 30 Sep. 2016, which claims priority to U.S. Provisional Application No. 62/235,608, flied 1 Oct. 2015, each of which is hereby incorporated by reference in its entirety as if fully set forth herein.

TECHNICAL FIELD

The present invention relates to hybrid-cure thermosetting compositions for additive fabrication processes.

BACKGROUND

Additive fabrication processes for producing three dimensional objects are well known. Additive fabrication processes utilize computer-aided design (CAD) data of an object to build three-dimensional parts. These three-dimensional parts may be formed from liquid resins, powders, or other materials.

A well-known, non-limiting example of an additive fabrication process is stereolithography (SL). Stereolithography is a process for rapidly producing models, prototypes, patterns, and production parts in certain applications. SL uses CAD data of an object wherein the data is transformed into thin cross-sections of a three-dimensional object. The data is loaded into a computer which controls a laser that traces a pattern of a cross section through a liquid radiation curable resin composition contained in a vat, solidifying a thin layer of the resin corresponding to the cross section. The solidified layer is recoated with resin and the laser traces another cross section to harden another layer of resin on top of the previous layer. The process is repeated layer by layer until the three-dimensional object is completed. When initially formed, the three-dimensional object is, in general, not fully cured, and is called a "green model." Although not required, the green model may be subjected to post-curing to enhance the mechanical properties of the finished part. An example of an SL process is described in, for example, U.S. Pat. No. 4,575,330.

Lasers have traditionally served as the radiation source of choice in additive fabrication processes such as stereolithography. The use of gas lasers to cure liquid radiation curable resin compositions is well known. The delivery of laser energy in a stereolithography system can be Continuous Wave (CW) or Q-switched pulses. CW lasers provide continuous laser energy and can be used in a high speed scanning process. Historically, several types of lasers have been used in stereolithography, with peak spectral outputs ranging traditionally from 193 nm to 355 nm in wavelength, although other wavelength variants exist. The light emitted from lasers is monochromatic, that is, a high percentage of the total spectral output occurs within a very narrow wavelength range. Amongst laser-based additive manufacturing systems in the industry, those operating at a peak spectral output of 355 nm have become most prevalent.

Laser-based systems, particularly those operating at a peak spectral output of at or near 355 nm, are not without their drawbacks, however. The significant power output of such laser-based systems sometimes generates excess heat at the point of irradiation which may be detrimental to the resin. Further, the use of a laser at any wavelength requires scanning point-by-point on the resin surface, a process which can be particularly time-consuming when the cross-sectional pattern to be cured is complex. Also, 355 nm laser-based systems are expensive and are associated with high maintenance costs and energy consumption.

To combat some of the drawbacks associated with laser-based systems, other additive fabrication systems have begun to utilize image projection technology as the source of actinic radiation. One example of this is Liquid Crystal Display (LCD), a technology that is well-known in other industries such as the manufacture of television sets and computer monitors. Another non-limiting example was developed by Texas Instruments called Digital Light Processing (DLP®). DLP systems selectively transfer light from an input source and project that light in a desired output pattern or mask using pixel-representative microscopic mirrors that are controlled by and affixed to a microchip known as a Digital Micromirror Device (DMD). DLP technology was developed to be used in image projection systems as an alternative display system to LCD-based technology. The exceptional image sharpness, brightness, and uniformity associated with DLP systems lends it well to additive fabrication wherein image resolution and precision is critical, as the boundaries of the light projected ultimately define that of the three-dimensional object to be cured and created. Furthermore, image projection systems such as LCD and DLP provide a theoretical speed advantage in that they enable an entire cross-sectional layer to be exposed and cured simultaneously. Furthermore, wherein the required cure time in laser-based systems is proportional to the complexity of the cross-section to be scanned, image projection systems are said to be cross-section independent, meaning the exposure time of a given layer does not change with increasing shape complexity of any given layer. This makes them particularly well-suited for parts created via additive fabrication with complex and detailed geometries.

DLP and LCD are not alternative methods of producing light itself; rather they provide a way of processing the light emanating from existing light sources into a more desirable pattern. Thus, coupled input light sources are also still needed. Although the light input to an image projection system may be from any source, including traditional lamps or even lasers, more commonly the input light is collimated from one or more light emitting diodes (LEDs).

LEDs are semiconductor devices which utilize the phenomenon of electroluminescence to generate light. At present, LED light sources for additive fabrication systems emit light at wavelengths between 300 and 475 nm, with 365 nm, 375 nm, 395 nm, 401 nm, 405 nm, and 420 nm being common peak spectral outputs. See textbook, "Light-Emitting Diodes" by E. Fred Schubert, $2^{nd}$ Edition, © E. Fred Schubert 2006, published by Cambridge University Press, for a more in-depth discussion of LED light sources. LEDs provide the advantage that they theoretically operate at close to peak efficiency for a longer duration than other light sources. Furthermore, they are typically more energy efficient and inexpensive to maintain, resulting in a lower initial and ongoing cost of ownership than laser-based optics systems.

Therefore, various additive fabrication systems have employed one of the following non-limiting examples of optics configurations: (1) laser only, (2) laser/DLP, (3) LED only, (4) LED/DLP, or (5) LED/LCD. Systems not utilizing DLP technology may also incorporate other collimating or focusing lenses/mirrors to selectively direct the light onto the liquid resin.

Recently, newer additive fabrication systems—regardless of the optics configuration—have begun to more frequently employ light sources that emit radiation at wavelengths greater than the traditional output at 355 nm. Others have shifted away from monochromatic light sources, opting instead for those which emit light possessing a wider spectral output distribution. Thus, such newer systems incorporating laser/DLP-, LED-, LED/DLP-, or LED/LCD-based optics configurations have begun operate at peak spectral outputs of a longer wavelength and with wider spectral distributions than was previously common. The wavelengths employed therein have shifted away from 355 nm towards the direction of the visible spectrum, with some even possessing a peak spectral output into the visible range. Such longer wavelengths (i.e. from about 375 nm to about 500 nm) are heretofore referred to as "UV/vis".

Some non-limiting reasons commonly cited for the current trend towards the increasing use of optics in the UV/vis region are: (1) the reduced cost (both initial and maintenance costs) of light sources that operate in the UV/vis range, as well as (2) the fact that UV/vis light sources emit radiation at lower energies than light sources emitting deeper into the UV region, and, all else being equal, are less damaging to human tissue. This makes them less harmful upon accidental exposure than those operating deeper into the UV region. As the popularity of additive manufacturing continues to grow amongst the consumer, "prosumer", and industrial market segments, the need for additive fabrication systems employing lower-cost, less dangerous sources of actinic radiation with which to cure liquid photopolymers will become increasingly important.

The benefits of the utilization of a UV/vis light source/optics system are not without notable tradeoffs, however. To date, the largest drawback is the relatively increased difficulty with which to develop suitable photopolymers for systems utilizing UV/vis optics. One of the primary reasons for this is that in addition to the natural phenomenon of reduced energy of light at longer wavelengths, the intensity of commercial light sources also typically decreases as the wavelength of the peak spectral output increases. Thus, whereas the traditional 355 nm laser-based lights systems might impart an irradiance of 1500 $W/cm^2$ at the surface of a resin, known commercial systems operating at around 400 nm impart an irradiance of roughly only around $1/1000^{th}$ of that value at the surface of a resin. In fact, the irradiance at the resin surface imparted by the UV/vis optics on existing 365 nm or 405 nm DLP-based commercial additive fabrication systems can be as low as 0.1 $W/cm^2$ or even 0.0002 $W/cm^2$ for some more economical desktop units. These relatively reduced radiation energies/intensities make it more difficult for photopolymerization reactions to occur in the radiation-curable resins via such UV/vis optics unless exposure times become prohibitively long. This in turn increases part build times significantly, such that the theoretical speed advantage of photomasking display systems is negated. Furthermore, fewer photoinitiating systems—in particular cationic photoinitiating systems—exist on the market for promoting photopolymerization at such longer UV/vis wavelengths.

The aforementioned challenges have resulted in a limited number of photopolymers being made available for additive fabrication systems employing the modern optics systems operating in the UV/vis region, relative to the variety of options available for systems operating deeper into the UV region, such as 355 nm laser-based systems.

Radically-polymerizable resins are known to exist for systems employing UV/vis optics. Such resins generally consist of one or more (meth)acrylate compounds (or other free-radical polymerizable organic compounds) along with a free-radical photoinitiator for radical generation. U.S. Pat. No. 5,418,112 describes one such radical-curable system. Although radically-polymerizable resins will readily cure under even the relatively lower energy and lower intensity afforded by UV/vis optics, they are not suitable for all additive fabrication applications. First, (meth)acrylate based resins considered suitable for additive fabrication processes have traditionally produced cured parts with insufficient mechanical properties to be incorporated into many end-use applications. Therefore, they produce parts which are typically not robust enough for non-prototyping applications. Also, such resins typically exhibit problems of deformation, such as production of warped or malformed parts, because of residual strain due to the differential shrinkage during curing. Such problems are exacerbated on larger-platform additive fabrication machines, wherein the cumulative differential shrinkage effect amplifies part warping or malformation as cured objects become larger. These problems of deformation can be partially rectified through software which accounts for known shrinkage rates by modifying the CAD file from which a solid three-dimensional part is generated. However, software corrections are insufficient to completely compensate for deformation in parts which have intricate and complicated shapes, or require a strict dimensional tolerance across long distances.

Another well-known type of resin suitable for use in additive fabrication systems is a "hybrid" curable resin, or one that comprises: (1) epoxies, oxetanes, or other types of cationically polymerizable compounds; (2) one or more cationic photoinitiators; (3) acrylate resins or other types of free radical polymerizable compounds; and (4) one or more free radical photoinitiators. Examples of such hybrid curable systems are described in, for example, U.S. Pat. No. 5,434,196. Such resins have long-been known to result in cured parts produced via additive fabrication processes with superior mechanical properties relative to all-acrylate based resins. Furthermore, hybrid curable systems are superior to all-acrylate systems in that they suffer less from the differential shrinkage problems which have long-plagued all-acrylate systems.

However, because the ring-opening process of cationic polymerization generally occurs more slowly and requires more activation energy than free radical polymerization, it is inherently more difficult to ensure that such formulations for additive fabrication applications adequately cure, or successfully "build" a three dimensional object. And even if curing does at least partially occur after the hybrid-curable resin is subjected to actinic radiation, the green model produced therefrom possesses insufficient mechanical strength (or "green strength") as measured by, for example, modulus of elasticity or fracture strength, to be used in many additive manufacturing applications. Such problems are significantly exacerbated by UV/vis optics that emit radiation at lower energies and intensities than conventional systems.

Because of limitations with regards to cationic polymerization, heretofore, no known hybrid liquid radiation curable resin for additive fabrication exists that is suitable for more modern additive fabrication systems employing UV/vis optics. Furthermore, no liquid radiation curable resin for additive fabrication exists—hybrid curable or otherwise— that is suitable for additive fabrication systems employing UV/vis optics and also is simultaneously (1) sufficiently fast-curing, (2) able to impart sufficient mechanical strength, and (3) resistant to shrinkage or warping, thereby preventing deformation into the three dimensional parts from which it is cured.

From the foregoing, it is evident that a heretofore unmet need exists to provide hybrid curable, liquid radiation resin compositions that are suitable for use in additive fabrication systems employing UV/vis optics that can produce three-dimensional parts with mechanical properties at least equal to existing hybrid-curable materials designed for traditional, laser-based 355 nm systems.

BRIEF SUMMARY

Described herein are several embodiments of the invention. A first embodiment is a liquid UV/vis radiation curable composition for additive fabrication including: a photoinitiating package, which further includes from about 0.1 wt. % to about 15 wt. % of an iodonium salt cationic photoinitiator, from about 0.1 wt. % to about 5 wt. % of a Norrish Type I photoinitiator, from about 0.1% to about 15 wt. % of an accelerator, and optionally, a photosensitizer; a cationically curable constituent, which further includes from about 1 wt. % to about 20 wt. % of an oxetane, from about 3 wt. % to about 40 wt. % of a cycloaliphatic epoxide, and from about 2 wt. % to about 40 wt. % of a glycidyl ether epoxide; from about 5 wt. % to about 40 wt. % of a free-radically polymerizable component; and optionally up to about 50 wt. % of one or more additives. The Norrish Type I photoinitiator of the composition of the first embodiment is further an alkyl-, aryl-, or acyl-substituted compound which possesses either a silicon, germanium, tin, or lead atom.

A second embodiment is a UV/vis radiation curable composition for additive fabrication including: first, a photoinitiating package, which further includes an onium salt cationic photoinitiator, a reductant (which itself further includes an effective amount of a Norrish Type I photoinitiator dissolved in a vinyl ether compound that is a liquid at 25 C), and optionally, a photosensitizer; second, a cationically polymerizable constituent; third, a free-radically polymerizable component; and fourth, optionally, one or more additives. The Norrish Type I photoinitiator of the composition of the second embodiment is also configured to enter a triplet state upon excitation by exposure to actinic radiation, wherein such excited triplet state possesses an ionization potential of from about 2.5 eV or about 3.0 eV to about 4.15 eV, or to about 3.98 eV, or to about 3.90, or to about 3.80 eV, or to about 3.70 eV, or to about 3.55 eV, if it is calculated in accordance with molecular modeling under B3LYP/6-31G(d) in combination with Koopman's Theorem ($IP=-\varepsilon_{HOMO}$).

A third embodiment is a method of forming a three-dimensional article via an additive fabrication system utilizing UV/vis optics, the method including the steps of first, providing the liquid radiation curable composition for additive fabrication according to any aspects of the first or second embodiments of the claimed invention; second, establishing a first liquid layer of the liquid radiation curable resin; third, exposing the first liquid layer imagewise to actinic radiation via optics configured to emit radiation at a peak spectral intensity of from about 375 nm to about 500 nm, or from about 380 nm to about 450 nm, or from about 390 nm to about 425 nm, or from about 395 nm to about 410 nm, so as to form an imaged cross-section, thereby forming a first cured layer; fourth, forming a new layer of liquid radiation curable resin in contact with the first cured layer; fifth, exposing said new layer imagewise to actinic radiation to form an additional imaged cross-section; and sixth, repeating the fourth and fifth step a sufficient number of times in order to build up a three-dimensional article.

A fourth embodiment is the three dimensional article formed via the method according to the third embodiment using the composition according to either the first or second embodiments.

Further embodiments of the invention are described below.

BRIEF DESCRIPTION OF THE DRAWINGS

FIG. 1 depicts a sample plot showing the % conversion as a function of time for two different compositions.

DETAILED DESCRIPTION

Throughout this document, "UV/vis" is defined as the region of the electromagnetic spectrum from greater than or equal to about 375 nanometers (nm) to less than or equal to about 500 nanometers (nm).

Accordingly, throughout this document "UV/vis optics" is defined as any electrical, mechanical, or electro-mechanical system which generates and directs/displays actinic radiation that operates at a peak spectral intensity in the UV/vis region. Specific non-limiting examples of UV/vis optics include lasers, LEDs, one or more LEDs coupled to a DLP display system, one or more LEDs which are coupled to a LCD display system, lasers coupled to a DLP display system, and lasers coupled to a LCD display system.

Compositions according to the present invention possess at least a photoinitiating package, a cationically curable/polymerizable constituent, a free-radically curable/polymerizable component, and optionally, one or more additives, each of which is described in turn below.

Photoinitiating Package

Compositions according to the present invention possess a photoinitiating package. The photoinitiating package comprises component(s) which tend to initiate, enable, facilitate, or catalyze chemical reactions that result in or improve the rate or amount of photopolymerization in a given composition when it is subjected to appropriate amounts of actinic radiation (particularly in the visible and/or UV spectral region). The most common constituent part of the photoinitiating package is one or more photoinitiators, although photosensitizers, reductants, and/or accelerators may further be used as described herein. A photoinitiator is a compound that undergoes a photoreaction upon absorption of actinic radiation (particularly in the visible and/or UV spectral region), whereupon reactive species are created. These reactive species are capable of catalyzing, initializing, or carrying out chemical reactions that result in significant changes in the physical properties of suitable formulations. Hence, the photoinitiator is a compound that can transform the physical energy of light into suitable chemical energy in the form of reactive intermediates. Common types of photoinitiators include cationic photoinitiators and free-radical photoinitiators.

Although photosensitizers can be capable of generating reactive species upon exposure to actinic radiation, they are useful primarily for their ability to increase the efficacy of an associated photoinitiator(s), either by increasing the rate of photoinitiated polymerization or by shifting the wavelength at which polymerization occurs. Finally, reductants and accelerators do not directly generate reactive species upon exposure to actinic reaction themselves, but still contribute to or accelerate the rate of polymerization through indirect mechanisms, such that the overall rate or amount of conversion (particularly epoxide and acrylate conversion) of the composition into which they are placed would be reduced in their absence. In a preferred embodiment, the reductants and/or accelerators improve the polymerization rate when the composition into which they are included is subjected to actinic radiation by additive fabrication systems employing UV/vis optics.

Cationic Photoinitiators

In accordance with an embodiment, the liquid radiation curable resin composition includes a cationic photoinitiator. The cationic photoinitiator initiates cationic ring-opening polymerization upon irradiation of light.

In an embodiment, any suitable onium salt-based cationic photoinitiator may be used, although iodonium-based cationic photoinitiators are preferred, for example, those with cations selected from the group consisting of diaryl iodonium salts, triaryl iodonium salts, aromatic iodonium salts, and any combination thereof.

In another embodiment, the cation of the cationic photoinitiator is selected from the group consisting of aromatic diazonium salts, aromatic sulfonium salts, aromatic iodonium salts, metallocene based compounds, aromatic phosphonium salts, and any combination thereof. In another embodiment, the cation is a polymeric sulfonium salt, such as in U.S. Pat. Nos. 5,380,923 or 5,047,568, or other aromatic heteroatom-containing cations and naphthyl-sulfonium salts such as in U.S. Pat. Nos. 7,611,817, 7,230,122, US2011/0039205, US2009/0182172, U.S. Pat. No. 7,678, 528, EP2308865, WO2010046240, or EP2218715. In another embodiment, the cationic photoinitiator is selected from the group consisting of triarylsulfonium salts, diaryliodonium salts, and metallocene based compounds, and any combination thereof. Onium salts, e.g., iodonium salts and sulfonium salts, and ferrocenium salts, have the advantage that they are generally more thermally stable.

In a particular embodiment, the cationic photoinitiator has an anion selected from the group consisting of $BF_4^-$, $AsF_6^-$, $SbF_6^-$, $PF_6^-$, $[B(CF_3)_4]^-$, $B(C_6F_5)_4^-$, $B[C_6H_3-3,5(CF_3)_2]_4^-$, $B(C_6H_4CF_3)_4^-$, $B(C_6H_3F_2)_4^-$, $B[C_6F_4-4(CF_3)]_4^-$, $Ga(C_6F_5)_4^-$, $[(C_6F_5)_3B-C_3H_3N_2-B(C_6F_5)_3]^-$, $[(C_6F_5)_3B-NH_2-B(C_6F_5)_3]^-$, tetrakis(3,5-difluoro-4-alkyloxyphenyl)borate, tetrakis(2,3,5,6-tetrafluoro-4-alkyloxyphenyl)borate, perfluoroalkylsulfonates, tris[(perfluoroalkyl)sulfonyl]methides, bis[(perfluoroalkyl)sulfonyl]imides, perfluoroalkylphosphates, tris(perfluoroalkyl)trifluorophosphates, bis(perfluoroalkyl)tetrafluorophosphates, tris(pentafluoroethyl)trifluorophosphates, and $(CH_6B_{11}Br_6)^-$, $(CH_6B_{11}Cl_6)^-$ and other halogenated carborane anions.

A survey of other onium salt initiators and/or metallocene salts can be found in "UV Curing, Science and Technology", (Editor S. P. Pappas, Technology Marketing Corp., 642 Westover Road, Stanford, Conn., U.S.A.) or "Chemistry & Technology of UV & EB Formulation for Coatings, Inks & Paints", Vol. 3 (edited by P. K. T. Oldring).

In an embodiment, the cationic photoinitiator has a cation selected from the group consisting of aromatic sulfonium salts, aromatic iodonium salts, and metallocene based compounds with at least an anion selected from the group consisting of $SbF_6^-$, $PF_6^-$, $B(C_6F_5)_4^-$, $[B(CF_3)_4]^-$, tetrakis(3,5-difluoro-4-methyloxyphenyl)borate, perfluoroalkylsulfonates, perfluoroalkylphosphates, tris[(perfluoroalkyl)sulfonyl]methides, and $[(C_2F_5)_3PF_3]^-$.

Examples of cationic photoinitiators suitable in other embodiments include 4-[4-(3-chlorobenzoyl)phenylthio]phenylbis(4-fluorophenyl)sulfonium hexafluoroantimonate, 4-[4-(3-chlorobenzoyl)phenylthio]phenylbis(4-fluorophenyl)sulfonium tetrakis(pentafluorophenyl)borate, 4-[4-(3-chlorobenzoyl)phenylthio]phenylbis(4-fluorophenyl)sulfonium tetrakis(3,5-difluoro-4-methyloxyphenyl)borate, 4-[4-(3-chlorobenzoyl)phenylthio]phenylbis(4-fluorophenyl)sulfonium tetrakis(2,3,5,6-tetrafluoro-4-methyloxyphenyl)borate, tris(4-(4-acetylphenyl)thiophenyl)sulfonium tetrakis(pentafluorophenyl)borate (Irgacure® PAG 290 from BASF), tris(4-(4-acetylphenyl)thiophenyl)sulfonium tris[(trifluoromethyl)sulfonyl]methide (Irgacure® GSID 26-1 from BASF), tris(4-(4-acetylphenyl)thiophenyl)sulfonium hexafluorophosphate (Irgacure® 270 from BASF), and HS-1 available from San-Apro Ltd.

In a preferred embodiment, the cationic photoinitiator component includes, either alone or in a mixture: bis[4-diphenylsulfoniumphenyl]sulfide bishexafluoroantimonate; thiophenoxyphenylsulfonium hexafluoroantimonate (available as Chivacure 1176 from Chitec), tris(4-(4-acetylphenyl)thiophenyl)sulfonium tetrakis(pentafluorophenyl)borate (Irgacure® PAG 290 from BASF), tris(4-(4-acetylphenyl)thiophenyl)sulfonium tris[(trifluoromethyl)sulfonyl]methide (Irgacure® GSID 26-1 from BASF), and tris(4-(4-acetylphenyl)thiophenyl)sulfonium hexafluorophosphate (Irgacure® 270 from BASF), [4-(1-methylethyl)phenyl](4-methylphenyl) iodonium tetrakis(pentafluorophenyl)borate (available as Bluesil PI 2074 from Bluestar Silicones), 4-[4-(2-chlorobenzoyl)phenylthio]phenylbis(4-fluorophenyl)sulfonium hexafluoroantimonate (as SP-172 from Adeka), SP-300 from Adeka, and aromatic sulfonium salts with anions of $(PF_{6-m}(C_nF_{2n+1})_m)^-$ where m is an integer from 1 to 5, and n is an integer from 1 to 4 (available as CPI-200K or CPI-200S, which are monovalent sulfonium salts from San-Apro Ltd., TK-1 available from San-Apro Ltd., or HS-1 available from San-Apro Ltd.).

In an embodiment of the invention, the liquid radiation curable resin for additive fabrication comprises an aromatic triaryl sulfonium salt cationic photoinitiator. Use of aromatic triaryl sulfonium salts in additive fabrication applications is known. Please see US 20120251841 to DSM IP Assets, B.V., U.S. Pat. No. 6,368,769, to Asahi Denki Kogyo, which discusses aromatic triaryl sulfonium salts with tetraaryl borate anions, including tetrakis(pentafluorophenyl)borate, and use of the compounds in stereolithography applications. Triarylsulfonium salts are disclosed in, for example, J Photopolymer Science & Tech (2000), 13(1), 117-118 and J Poly Science, Part A (2008), 46(11), 3820-29. Triarylsulfonium salts $Ar_3S^+MXn^-$ with complex metal halide anions such as $BF_4^-$, $AsF_6^-$, $PF_6^-$, and $SbF_6^-$, are disclosed in J Polymr Sci, Part A (1996), 34(16), 3231-3253.

An example of a triaryl sulfonium tetrakis(pentafluorophenyl)borate cationic photoinitiator is tris(4-(4-acetylphenyl)thiophenyl)sulfonium tetrakis(pentafluorophenyl)borate. Tris(4-(4-acetylphenyl)thiophenyl)sulfonium tetrakis(pentafluorophenyl)borate is known commercially as IRGACURE® PAG-290, and is available from Ciba/BASF.

In another embodiment, the cationic photoinitiator is an aromatic triaryl sulfonium salt that possesses an anion represented by $SbF_6^-$, $PF_6^-$, $BF_4^-$, $(CF_3CF_2)_3PF_3^-$, $(C_6F_5)_4B^-$, $((CF_3)_2C_6H_3)_4B^-$, $(C_6F_5)_4Ga^-$, $((CF_3)_2C_6H_3)_4Ga^-$, trifluoromethanesulfonate, nonafluorobutanesulfonate, methanesulfonate, butanesulfonate, benzenesulfonate, or p-toluenesulfonate. Such photoinitiators are described in, for example, U.S. Pat. No. 8,617,787.

Another cationic photoinitiator is an aromatic triaryl sulfonium cationic photoinitiator that possesses an anion that is a fluoroalkyl-substituted fluorophosphate. Commercial examples of an aromatic triaryl sulfonium cationic photoinitiator having a fluoroalkyl-substituted fluorophosphate anion is the CPI-200 series (for example CPI-200K® or CPI-210S®) or 300 series, available from San-Apro Limited.

There are also several commercially available cationic photoinitiators which are designed to be especially suitable for absorbing light and generating photoreactive species at UV/vis wavelengths. Incorporation of one or more of these cationic photoinitiators into a liquid radiation curable composition for UV/vis cure would be achieved through "direct" excitation of the photoinitiator. Some non-limiting examples of UV/vis-direct excitation cationic photoinitiators include: Irgacure 261, Irgacure PAG 103, and Irgacure PAG 121, each of which is available commercially from BASF, R-Gen® 262 ($\eta$ 5-2,4-cyclopentadien-1-yl)[(1,2,3,4,5,6-$\eta$)-(1-methylethyl)benzene]-iron(I)-hexafluoroantimonate), which is available commercially from Chitec Technology Co., and the CPI-400 series photoinitiators, which are available from San-Apro Limited.

Surprisingly, however, Applicants have found that the aforementioned UV/vis direct excitation cationic photoinitiators typically are not suitable for achieving sufficient hybrid cure of compositions used in additive fabrication processes utilizing UV/vis optics. Although not wishing to be bound by any theory, it is surmised that, since the free radical portion of the polymer network cures at a much higher rate, the free radical curing portion of the resin builds up viscosity and polymer structure thus significantly reducing the molecular mobility of the slower curing cationic curing species thereby significantly reducing overall cure speed to an unacceptably low rate. This problem is inherent to in a dual-cure hybrid resin which is exacerbated at the longer wavelengths, lower energies, and lower intensities characteristic of modern UV/vis optics. Therefore, Applicants have discovered that formulation of a suitable hybrid-cure, radiation curable composition for additive fabrication at UV/vis wavelengths is not accomplished by merely changing the cationic photoinitiators in a hybrid resin suitable for UV cure by, for example 355 nm laser-based systems. Inventors have discovered therefore that such "direct excitation" mechanisms for achieving suitable hybrid cure are insufficient to meet the processing realities of modern additive fabrication systems utilizing UV/vis optics.

Rather, Applicants have surprisingly discovered that a combination of one or more alternative mechanisms are instead needed to effectuate sufficient cure in additive fabrication systems utilizing UV/vis optics. The first is via an "indirect excitation" mechanism akin to photosensitization. A second is via a free-radically promoted cationic polymerization mechanism. A third, functionally similar mechanism, is via the creation of an active cation resulting from the oxidation of an ether radical formed from addition of certain photoinitiator fragments to a vinyl ether, also known as a vinyl ether polymerization mechanism. As is discussed further, infra, radiation curable compositions for additive fabrication fashioned according to the present invention further include additional photoinitiating package elements such as reductants, accelerators, and/or photosensitizers in order to employ one or more of these mechanisms synergistically to achieve suitable hybrid cure in additive fabrication processes incorporating UV/vis optics.

The liquid radiation curable resin composition can include any suitable amount of the cationic photoinitiator, for example, in certain embodiments, in an amount up to about 15% by weight of the resin composition, in certain embodiments, up to about 5% by weight of the resin composition, and in further embodiments from about 2% to about 10% by weight of the resin composition, and in other embodiments, from about 0.1% to about 5% by weight of the resin composition. In a further embodiment, the amount of cationic photoinitiator is from about 0.2 wt. % to about 4 wt. % of the total resin composition, and in other embodiments from about 0.5 wt. % to about 3 wt. %.

Free-Radical, esp. Norrish Type I Photoinitiators

Compositions of the present invention also include a free-radical photoinitiator. In accordance with an embodiment, the liquid radiation curable resin composition includes a photoinitiating system containing at least one photoinitiator having a cationic initiating function, and at least one photoinitiator having a free radical initiating function. Additionally, the photoinitiating system can include a photoinitiator that contains both free-radical initiating function and cationic initiating function on the same molecule. As noted, the photoinitiator is a compound that chemically changes due to the action of light or the synergy between the action of light and the electronic excitation of a sensitizing dye to produce at least one of a radical, an acid, and a base.

Typically, free radical photoinitiators are divided into those that form radicals by cleavage, known as "Norrish Type I" and those that form radicals by hydrogen abstraction, known as "Norrish Type II". The Norrish Type II photoinitiators require a hydrogen donor, which serves as the free radical source. As the initiation is based on a bimolecular reaction, the Norrish Type II photoinitiators are generally slower than Norrish Type I photoinitiators which are based on the unimolecular formation of radicals. On the other hand, Norrish Type II photoinitiators are generally considered to possess better optical absorption properties in the near-UV spectroscopic region. However, inventors have currently found that Type II photoinitiators are less preferable for use in compositions according to the current invention, because as they represent a combination of a sensitizer with an oxidizable group such as an amine, they would be expected to inhibit cationic cure.

Photolysis of aromatic ketones, such as benzophenone, thioxanthones, benzil, and quinones, in the presence of hydrogen donors, such as alcohols, amines, or thiols leads to the formation of a radical produced from the carbonyl compound (ketyl-type radical) and another radical derived from the hydrogen donor. The photopolymerization of vinyl monomers is usually initiated by the radicals produced from the hydrogen donor. The ketyl radicals are usually not reactive toward vinyl monomers because of the steric hindrance and the delocalization of an unpaired electron.

To successfully formulate a liquid radiation curable resin for additive fabrication, it is necessary to review the wavelength sensitivity of the photoinitiator(s) present in the resin composition to determine if they will be activated by the radiation source chosen to provide the curing light.

In accordance with an embodiment, the liquid radiation curable resin for additive fabrication includes at least one free radical photoinitiator selected from the group consisting of benzoylphosphine oxides, aryl ketones, benzophenones, hydroxylated ketones, 1-hydroxyphenyl ketones, ketals, metallocenes, and any combination thereof.

In an embodiment, the liquid radiation curable resin for additive fabrication includes at least one free-radical photoinitiator selected from the group consisting of 2,4,6-trimethylbenzoyl diphenylphosphine oxide and 2,4,6-trimethylbenzoyl phenyl, ethoxy phosphine oxide, bis(2,4,6-trimethylbenzoyl)-phenylphosphineoxide, 2-methyl-1-[4-(methylthio)phenyl]-2-morpholinopropanone-1,2-benzyl-2-(dimethylamino)-1-[4-(4-morpholinyl) phenyl]-1-butanone, 2-dimethylamino-2-(4-methyl-benzyl)-1-(4-morpholin-4-yl-phenyl)-butan-1-one, 4-benzoyl-4'-methyl diphenyl sulphide, 4,4'-bis(diethylamino) benzophenone, and 4,4'-bis(N, N'-dimethylamino) benzophenone (Michler's ketone), benzophenone, 4-methyl benzophenone, 2,4,6-trimethyl benzophenone, dimethoxybenzophenone, 1-hydroxycyclohexyl phenyl ketone, phenyl (1-hydroxyisopropyl)ketone, 2-hydroxy-1-[4-(2-hydroxyethoxy) phenyl]-2-methyl-1-propanone, 4-isopropylphenyl(1-hydroxyisopropyl)ketone, oligo-[2-hydroxy-2-methyl-1-[4-(1-methylvinyl)phenyl] propanone], camphorquinone, 4,4'-bis(diethylamino) benzophenone, benzil dimethyl ketal, bis(eta 5-2-4-cyclopentadien-1-yl) bis[2,6-difluoro-3-(1H-pyrrol-1-yl) phenyl]titanium, and any combination thereof.

For light sources emitting in the 300-475 nm wavelength range, especially those emitting at 365 nm, 390 nm, or 395 nm, examples of suitable free-radical photoinitiators absorbing in this area include: benzoylphosphine oxides, such as, for example, 2,4,6-trimethylbenzoyl diphenylphosphine oxide (Lucirin TPO from BASF) and 2,4,6-trimethylbenzoyl phenyl, ethoxy phosphine oxide (Lucirin TPO-L from BASF), bis(2,4,6-trimethylbenzoyl)-phenylphosphineoxide (Irgacure 819 or BAPO from Ciba), 2-methyl-1-[4-(methylthio)phenyl]-2-morpholinopropanone-(Irgacure 907 from Ciba), 2-benzyl-2-(dimethylamino)-1-[4-(4-morpholinyl) phenyl]-1-butanone (Irgacure 369 from Ciba), 2-dimethylamino-2-(4-methyl-benzyl)-1-(4-morpholin-4-yl-phenyl)-butan-1-one (Irgacure 379 from Ciba), 4-benzoyl-4'-methyl diphenyl sulphide (Chivacure BMS from Chitec), 4,4'-bis (diethylamino) benzophenone (Chivacure EMK from Chitec), and 4,4'-bis(N,N'-dimethylamino) benzophenone (Michler's ketone). Also suitable are mixtures thereof. These acyl phosphine oxide photoinitiators are preferred since they have a good delocalization of the phosphinoyl radical upon photo irradiation.

According to a preferred embodiment of the present invention, the free-radical photoinitiator is of the Norrish Type I variety. According to an embodiment, the free-radical photoinitiator is an alkyl-, aryl-, or acyl-substituted compound. In an embodiment the alkyl-, aryl-, or acyl-substituted photoinitiator possesses or is centered around an atom in the Carbon (Group 14) group. In such instance, upon excitation (via absorption of radiation) the Group 14 atom present in the photoinitiator compound forms a radical. Such compound may therefore produce a radical possessing or centered upon an atom selected from the group consisting of carbon, silicon, germanium, tin, and lead. In an embodiment, the alkyl-, aryl-, or acyl-substituted photoinitiator is an acylgermanium compound.

In an embodiment, the free-radical photoinitiator is a germanium-based compound that possesses a structure in accordance with the following formula (I):

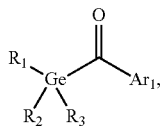
(I)

in which $Ar_1$ is an aromatic group, either unsubstituted or further substituted in any position by one or more alkyl radicals, ethers, sulfides, silyl groups, halogens, carboxyl groups, vinyl groups, additional aromatic or heterocyclic groups, alkyl radicals, or aromatic or heterocyclic groups interrupted by one or more ether, sulfide, silyl, carboxyl, or vinyl groups, and in which $R_1$, $R_2$, and $R_3$ independently may be an acyl, aryl, alkyl, or carbonyl group, either unsubstituted or further substituted one or more alkyl radicals, ethers, sulfides, silyl groups, halogens, carboxyl groups, vinyl groups, additional aromatic or heterocyclic groups, alkyl radicals, or aromatic or heterocyclic groups interrupted by one or more ether, sulfide, silyl, carboxyl, or vinyl groups.

In an embodiment, each of $R_1$-$R_3$ is an aryl-substituted or aromatic acyl group. In an embodiment, exactly two of $R_1$-$R_3$ are an aryl-substituted or aromatic acyl group, with the remaining substituted groups being a $C_1$-$C_{10}$, or a $C_1$-$C_6$, or a $C_1$-$C_3$ alkyl. In an embodiment, exactly one of $R_1$-$R_3$ is an aryl-substituted or aromatic acyl group, with the remaining two substituted groups being a $C_1$-$C_{10}$, or a $C_1$-$C_6$, or a $C_1$-$C_3$ alkyl. In another embodiment, each of $R_1$-$R_3$ is a $C_1$-$C_{10}$, or a $C_1$-$C_6$, or a $C_1$-$C_3$ alkyl.

In an embodiment, the acylgermanium photoinitiator is a compound possessing one of the following molecular structures:

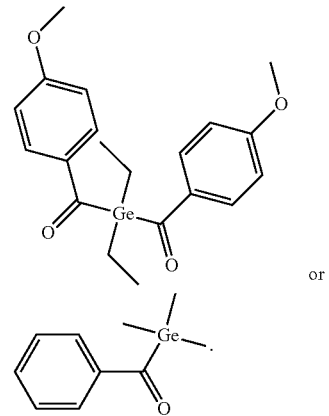

In an embodiment, the free-radical photoinitiator is an acylgermanium compound. In an embodiment, the acylgermanium is a benzoyl trimethyl germane (BTG) or bis acyl germanoyl (commercially available as Ivocerin® from Ivoclar Vivadent AG, 9494 Schaan/Liecthenstein).

According to another embodiment of the present invention, the free-radical photoinitiator is an acylphosphine oxide photoinitiator. Acylphosphine oxide photoinitiators are disclosed for example in U.S. Pat. Nos. 4,324,744, 4,737,593, 5,942,290, 5,534,559, 6,020,528, 6,486,228, and 6,486,226.

The acylphosphine oxide photoinitiators are bisacylphosphine oxides (BAPO) or monoacylphosphine oxides (MAPO).

The bisacylphosphine oxide photoinitiators are of the following formula:

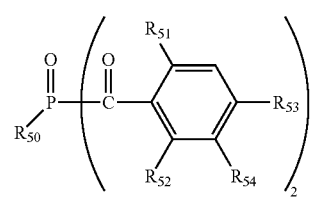

wherein $R_{50}$ is $C_1$-$C_{12}$ alkyl, cyclohexyl or phenyl which is unsubstituted or is substituted by 1 to 4 halogen or $C_1$-$C_8$ alkyl; $R_{51}$ and $R_{52}$ are each independently of the other $C_1$-$C_8$ alkyl or $C_1$-$C_8$ alkoxy; $R_{53}$ is hydrogen or $C_1$-$C_8$ alkyl; and $R_{54}$ is hydrogen or methyl.

For example, $R_{50}$ is $C_2$-$C_{10}$ alkyl, cyclohexyl or phenyl which is unsubstituted or is substituted by 1 to 4 $C_1$-$C_4$ alkyl, Cl or Br. Another embodiment is where $R_{50}$ is $C_3$-$C_8$ alkyl, cyclohexyl or phenyl which is unsubstituted or is substituted in the 2-, 3-, 4- or 2,5-positions by $C_1$-$C_4$ alkyl. For instance, $R_{50}$ is $C_4$-$C_{12}$ alkyl or cyclohexyl, $R_{51}$ and $R_{52}$ are each independently of the other $C_1$-$C_8$ alkyl or $C_1$-$C_8$alkoxy and $R_{53}$ is hydrogen or $C_1$-$C_8$ alkyl. For instance, $R_{51}$ and $R_{52}$ are $C_1$-$C_4$ alkyl or $C_1$-$C_4$alkoxy and $R_{53}$ is hydrogen or $C_1$-$C_4$ alkyl. Another embodiment is where $R_{51}$ and $R_{52}$ are methyl or methoxy and $R_{53}$ is hydrogen or methyl. For example $R_{51}$, $R_{52}$ and $R_{53}$ are methyl. Another embodiment is where $R_{51}$, $R_{52}$ and $R_{53}$ are methyl and $R_{50}$ is hydrogen. Another embodiment is where $R_{50}$ is $C_3$-$C_8$ alkyl. For example, $R_{51}$ and $R_{52}$ are methoxy, $R_{53}$ and $R_{54}$ are hydrogen and $R_{50}$ is isooctyl. For instance $R_{50}$ is isobutyl. For example $R_{50}$ is phenyl. The present bisacylphosphine oxide photoinitiator is for example bis(2,4,6-trimethylbenzoyl)-phenylphosphine oxide (CAS#162881-26-7) or is bis(2,4,6-trimethylbenzoyl)-(2,4-bis-pentyloxyphenyl)phosphine oxide.

The monoacylphosphine oxide photoinitiators are of the following formula:

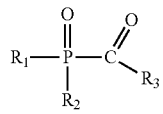

in which $R_1$ and $R_2$ independently of one another are $C_1$-$C_{12}$alkyl, benzyl, phenyl which is unsubstituted or substituted from one to four times by halogen, $C_1$-$C_8$ alkyl and/or $C_1$-$C_8$ alkoxy, or are cyclohexyl or a group —$COR_3$, or $R_1$ is —$OR_4$; $R_3$ is phenyl which is unsubstituted or substituted from one to four times by $C_1$-$C_8$ alkyl, $C_1$-$C_8$ alkoxy, $C_1$-$C_8$ alkylthio and/or halogen; and $R_4$ is $C_1$-$C_8$ alkyl, phenyl or benzyl. For example, $R_1$ is —$OR_4$. For example $R_2$ is phenyl which is unsubstituted or substituted from one to four times by halogen, $C_1$-$C_8$ alkyl and/or $C_1$-$C_8$ alkoxy. For example $R_3$ is phenyl which is unsubstituted or substituted from one to four times by $C_1$-$C_8$ alkyl. For example, the present monoacylphosphine oxide is 2,4,6-trimethylbenzoylethoxyphenylphosphine oxide or 2,4,6-trimethylbenzoyldiphenylphosphine oxide.

Inventors have surprisingly discovered that certain Norrish Type I photoinitiators are particularly effective at facilitating cationic polymerization under UV/vis cure conditions. Inventors have discovered that this is likely due to their ability to readily reduce onium (and in particular iodonium) salts, particularly when such Norrish Type I photoinitiators exist in their associated excited triplet state. Indeed, Inventors have discovered that the oxidation potentials of such triplet states are important to the promotion of satisfactory levels of cationic polymerization, particularly when the composition into which they are associated is used in additive fabrication processes employing UV/vis optics. Unfortunately it is virtually impossible to directly determine via cyclic voltammetry the oxidation potential of these excited triplet states, due to their miniscule lifetimes. However, Inventors have devised an alternative way to quantify a component's oxidation potential via derivation of its ionization potential, i.e. the energy required to lose one of its electrons (X=energy→$X^+$+$e^-$). The ionization potential has been obtained from quantum mechanical calculations employing the B3LYP/6-31G(d) method in combination with Koopman's Theorem, which states that the ionization potential can be calculated as the negative of the orbital energy of the highest occupied molecular orbital (HOMO), or expressed as an equation as: IP=$-\varepsilon_{HOMO}$.

In a preferred embodiment, therefore, the Norrish Type I photoinitiator is chosen such that it possesses a triplet state ionization potential of less than 4.15 electron volts (eV), more preferably less than 3.98 eV, more preferably less than 3.90 eV, more preferably less than 3.80 eV, more preferably less than 3.70 eV, more preferably less than 3.55 eV. Furthermore, in a preferred embodiment, the Norrish Type I photoinitiator is chosen such that it possesses a triplet state ionization potential of at least 2.5 eV, more preferably at least 3.0 eV.

Inventors have surprisingly also discovered that in order to further promote levels of cationic polymerization (via the facilitation of the generation of more cations), it is useful to select a Norrish Type I photoinitiator that not only reduces the associated cationic photoinitiator while in its temporary triplet state, but also is capable of forming a radical which additionally is involved in a redox reaction of the cationic photoinitiator (preferably an iodonium salt). Such radicals may be formed according to any mechanism, including (but not necessarily limited to) cleavage, hydrogen abstraction, addition, and backbiting. Accordingly, molecular modeling under B3LYP/6-31G(d) in combination with Koopman's Theorem is again useful to enable the calculation of the ionization potentials of various radicals known to be associated with one or more Norrish Type I photoinitiators described herein. These values, although expressed herein in terms of the same units as the ionization potentials of the Norrish Type I photoinitiators' excited triplet states (electron volts or eV), should not be compared directly thereto. Instead, such values are useful only to be considered relative to each other.

In a preferred embodiment, therefore, Norrish Type I photoinitiators are chosen that are known to be configured to form a radical with a calculated ionization potential of less than or equal to 5.50 eV, more preferably less than 5.00 eV, and more preferably less than 4.80 eV, and at least about 4.05 eV.

Inventors have surprisingly further discovered that the ready addition of a radical formed by certain Norrish Type I photoinitiators, described supra, to a component possessing an electron-donating substituent attached to a vinyl group (particularly vinyl ether), described infra, is particularly desirable in further promoting the amount and/or rate of cationic polymerization in a composition that is used in additive fabrication applications employing UV/vis optics. This is because the resulting addition product is also believed to be useful in participating in an oxidation/reduction reaction, whereby it reduces the cationic photoinitiator (particularly of the iodonium salt type), thereby forming additional active cations. There is a very limited amount of known data on this concept in the literature, but some values are summarized below:

| Radical | Rate of addition to vinyl ether ($M^{-1} s^{-1}$) | Reference or remark |
|---|---|---|
| triphenylgermyl radical | $3.2 \times 10^6$ | 1 |
| (4-methoxybenzoyl)diethylgermyl radical | $\sim 3 \times 10^6$ | Estimated |
| tert-butyl radical | $3.9 \times 10^2$ | 2 |
| 2-hydroxypropan-2-yl radical | $3.2 \times 10^2$ | 2 |
| benzoyl radical | $\sim 10^2$ | Estimated |
| (2,4,6-trimethylbenzoyl)phenylphosphinoyl radical | $10^3$–$10^4$ | Estimated |

1 J. Lalevee, X. Allonas, J. P. Fouassier, *Chem. Phys. Lett.* 469, 298 (2009).
2 H. Fisher, L. Radom, *Angew. Chem. Int. Ed.* 40, 1340 (2001).

In a preferred embodiment, therefore, the composition contains a Norrish Type I photoinitiator that is configured to produce a radical that undergoes a rate of addition to a component possessing an electron-donating substituent attached to a vinyl group, preferably vinyl ether, of greater than $10^4$ $M^{-1}$ $s^{-1}$, more preferably $10^5$ $M^{-1}$ $s^{-1}$, most preferably greater than or equal to $3 \times 10^5$ $M^{-1}$ $s^{-1}$.

The liquid radiation curable resin for additive fabrication can include any effective amount of the free-radical photoinitiator, for example, in certain embodiments, relative to the weight of the entire composition, in an amount up to about 10 wt. %, in certain embodiments, from about 0.1 wt. % to about 10 wt. % of the resin composition, and in further embodiments from about 0.5 to about 6 wt. % of the resin composition, and in further embodiments from about 1 wt. % to about 3 wt. %.

Photosensitizers

In some embodiments, depending on the wavelength of light used for curing the liquid radiation curable resin, it is desirable for the liquid radiation curable resin composition to include a photosensitizer. The term "photosensitizer" generally refers to any substance that increases the rate of photoinitiated polymerization, particularly by shifting the wavelength at which an associated photoinitiator is effective at inducing polymerization to occur; see textbook by G. Odian, *Principles of Polymerization*, 3rd Ed., 1991, page 222. Photosensitizers generally act by absorbing light in the ultraviolet or visible region of the electromagnetic spectrum, and then transferring it to adjacent molecules. Many of the photosensitizers described herein "photosensitize" the associated cationic photoinitiator in the composition. At UV/vis wavelengths, at least, such photosensitization typically occurs more readily with iodonium salt cationic photoinitiators. Substances which operate in conjunction with photoinitiators that would otherwise not absorb sufficient light of a specific wavelength are said to operate by way of an "indirect excitation" mechanism with their associated photoinitiator. Applicants have harnessed this mechanism to formulate compositions of the current invention which are suitable for cure via UV/vis optics.

A variety of compounds can be used as photosensitizers, including heterocyclic and fused-ring aromatic hydrocarbons, organic dyes, and aromatic ketones. Examples of photosensitizers include those selected from the group consisting of methanones, xanthenones, pyrenemethanols, anthracenes, pyrene, perylene, quinones, xanthones, thioxanthones, benzoyl esters, benzophenones, and any combination thereof. Particular examples of photosensitizers include those selected from the group consisting of [4-[(4-methylphenyl)thio]phenyl]phenyl-methanone, isopropyl-9H-thioxanthen-9-one, 1-pyrenemethanol, 9-(hydroxymethyl)anthracene, 9,10-diethoxyanthracene, 9,10-dimethoxyanthracene, 9,10-dipropoxyanthracene, 9,10-dibutyloxyanthracene, 9-anthracenemethanol acetate, 2-ethyl-9,10-dimethoxyanthracene, 2-methyl-9,10-dimethoxyanthracene, 2-t-butyl-9,10-dimethoxyanthracene, 2-ethyl-9,10-diethoxyanthracene and 2-methyl-9,10-diethoxyanthracene, anthracene, anthraquinones, 2-methylanthraquinone, 2-ethylanthraquinone, 2-tertbutylanthraquinone, 1-chloroanthraquinone, 2-amylanthraquinone, thioxanthones and xanthones, isopropyl thioxanthone, 2-chlorothioxanthone, 2,4-diethylthioxanthone, 1-chloro-4-propoxythioxanthone, methyl benzoyl formate (Darocur MBF from BASF), methyl-2-benzoyl benzoate (Chivacure OMB from Chitec), 4-benzoyl-4'-methyl diphenyl sulphide (Chivacure BMS from Chitec), 4,4'-bis(diethylamino) benzophenone (Chivacure EMK from Chitec), and any combination thereof.

The novel mixtures may also contain various photoinitiators of different sensitivity to radiation of emission lines with different wavelengths to obtain a better utilization of a UV light source. The use of known photoinitiators of different sensitivity to radiation of emission lines is well known in the art of additive fabrication, and may be selected in accordance with radiation sources of, for example, 351, nm 355 nm, 365 nm, 385 nm, and 405 nm. In this context it is advantageous for the various photoinitiators to be selected such, and employed in a concentration such, that equal optical absorption is produced with the emission lines used.

In an embodiment, the photosensitizer is a fluorone, e.g., 5,7-diiodo-3-butoxy-6-fluorone, 5,7-diiodo-3-hydroxy-6-fluorone, 9-cyano-5,7-diiodo-3-hydroxy-6-fluorone, or a photosensitizer is

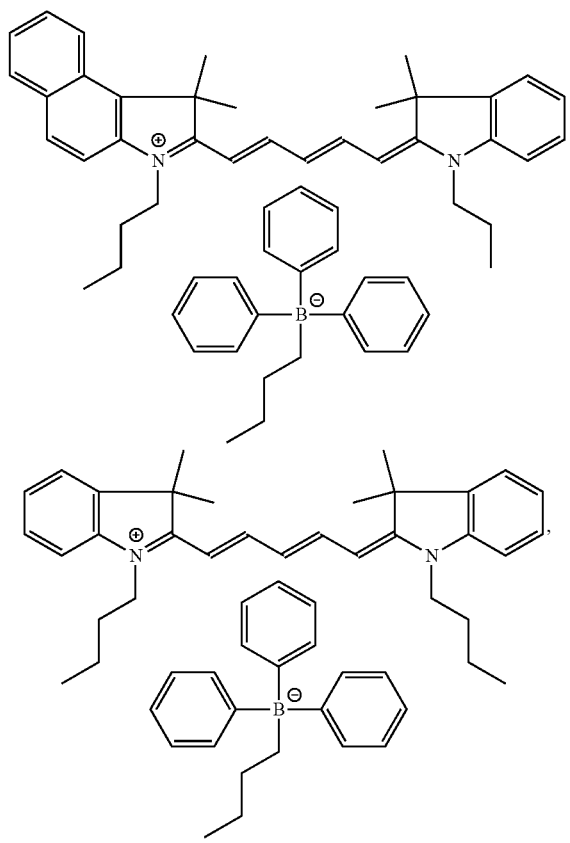

and any combination thereof.

When photosensitizers are employed, other photoinitiators absorbing at shorter wavelengths can be used. Examples of such photoinitiators include: benzophenones, such as benzophenone, 4-methyl benzophenone, 2,4,6-trimethyl benzophenone, and dimethoxybenzophenone, and 1-hydroxyphenyl ketones, such as 1-hydroxycyclohexyl phenyl ketone, phenyl (1-hydroxyisopropyl)ketone, 2-hydroxy-1-[4-(2-hydroxyethoxy) phenyl]-2-methyl-1-propanone, and 4-isopropylphenyl(1-hydroxyisopropyl)ketone, benzil dimethyl ketal, and oligo-[2-hydroxy-2-methyl-1-[4-(1-methylvinyl)phenyl] propanone] (Esacure KIP 150 from Lamberti).

It can be noted that some cationic photoinitiators have low absorption at the preferred actinic wavelength. For example, in an embodiment, an additive fabrication application of interest utilizes UV/optics having a peak intensity at about 400 nm. Iodonium salts, such as, for example, Bluesil PI 2074, available from Bluestar Silicones, Irgacure 250 Iodonium, (4-methylphenyl)[4-(2-methylpropyl)phenyl]-hexafluorophosphate(1-) available from Ciba, and UV9380c, available from GE Silicones, have insufficient direct absorption at the preferred wavelength and therefore require excessive concentration, a sensitizer, or some other mechanism to induce sufficient photoinitiation. Therefore, triplet sensitizers such as thioxanthones and Michelers ketone are sometimes used to absorb the actinic energy and then transfer the energy to the iodonium initiator in an efficient manner. However, the thioxanthones and Michelers ketones are prone to orange or red color formation, safety concerns, and, while they have significant actinic absorption out to 430 nm, they are not very effective at sensitizing the photoreaction at curing light wavelengths of about 400 nm.

In an embodiment, therefore, chloropropyl thioxanthone (CPTX) is a suitable sensitizer for iodonium initiators especially for use in stereolithography since it does not have significant light absorption above 500 nm and creates articles with less color.

In order to reduce the concentration of sensitizers used in a formulation and prevent adverse effects that may result from relatively large concentrations of sensitizers on the final physical properties of the composition, it is preferable to use sensitizers with high extinction coefficients at 400 nm. For example, benzophenone may, in some cases, act as a triplet sensitizer, but at laser wavelengths of, for example, a frequency tripled YAG laser (Coherent AVIA model #355-1800) operating at approximately 355 nm, the extinction coefficient is on the order of 108 liters/mole-cm. On the other hand, CPTX, using the same laser at the same laser wavelength of approximately 400 nm, has an extinction coefficient of almost 25 times that of benzophenone, at 2585 liters/mole-cm. This suggests that CPTX may require only approximately ¹/₂₅ the concentration in a formulation to provide an equivalent light absorption effect. It is, therefore, preferred—although not required—for the sensitizer to have an extinction coefficient greater than 300 liters/mole-cm, or higher such as greater than 1000 liters/mole-cm, and preferably greater than 2000 liters/mole-cm at curing light wavelengths greater than 380 nm.

While it is taught that CPTX may be used to improve the activity of the cationic photoinitiator, the sensitizer used in combination with the above-mentioned cationic photoinitiators is not necessarily limited thereto. A variety of compounds can be used as photosensitizers, including heterocyclic and fused-ring aromatic hydrocarbons, organic dyes, and aromatic ketones. Examples of sensitizers include compounds disclosed by J. V. Crivello in *Advances in Polymer Science,* 62, 1 (1984), and by J. V. Crivello & K. Dietliker, "Photoinitiators for Cationic Polymerization" in Chemistry & technology of UV & EB formulation for coatings, inks & paints. Volume III, Photoinitiators for free radical and cationic polymerization by K. Dietliker; [Ed. by P. K. T. Oldring], SITA Technology Ltd, London, 1991. Specific examples include polyaromatic hydrocarbons and their derivatives such as anthracene, pyrene, perylene and their derivatives, substituted thioxanthones, α-hydroxyalkylphenones, 4-benzoyl-4'-methyldiphenyl sulfide, acridine orange, and benzoflavin.

In an embodiment, the photosensitizer may be chosen generally according to the description of photosensitizers according to the second aspect of the invention. In a preferred embodiment, the photosensitizer employed possesses a structure according to the following formula:

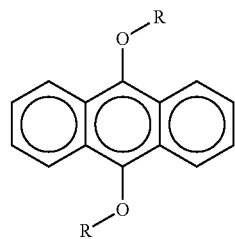

wherein R contains an aliphatic chain from $C_1$-$C_{20}$;

In a preferred embodiment of the third aspect of the invention, the photosensitizer employed is an anthracene-based photoinitiator. Commercially available of such photosensitizers include Anthracure™ UVS-1101 and UVS-1331, available from Kawasaki Chemical.

In embodiments of the invention, the photosensitizer is an optional component. In embodiments, particularly where the combination of other components in a photoinitiating package enable sufficient polymerization given the cure conditions to which they are subjected, a separate photosensitizer is not required. In some such cases, however, an additional photosensitizer may still be included, not for the purpose of substantially further increasing the rate or amount of photoinduced polymerization, but rather as a UV-absorber to control the depth of penetration (Dp) of the resin into which it is incorporated. This allows the formulator to tailor a resin for additive fabrication processes having a desired cure thickness without detrimentally affecting cure rate at that thickness. This will be incorporated as is appreciated by those of skill in the art.

If used, the liquid radiation curable resin for additive fabrication can include any suitable amount of photosensitizer, for example, in certain embodiments, in an amount from 0.1 wt. % to 10 wt. % of the resin composition, in certain embodiments, from about 1 wt. % to about 8 wt. % of the resin composition, and in further embodiments from about 2 wt. % to about 6 wt. % of the resin composition. In an embodiment, the above ranges are particularly suitable for use with epoxy monomers. In another embodiment, the photosensitizer may be employed in an amount of from about 0.05 wt. % to about 3 wt. %, or 0.5 wt. % to 2 wt. %, by weight of the total composition to which it is incorporated.

Reductants

As used herein, reductants are components that lose, or "donate," one or more electrons to enable the creation of an active cation in an oxidation/reduction chemical reaction during polymerization of the liquid radiation compositions for additive fabrication according to the current invention. Such components are still considered to be reductants for present purposes even though they may not possess the ability to readily donate an electron until they have formed a free-radical after being acted upon by an outside stimulus (such as dissociation upon being subjected to actinic radiation at UV/vis wavelengths). In any event, in such a redox reaction, reductants are said to have reduced the cationic photoinitiator (or a derivative thereof), whereupon they themselves (or their free-radicals after being acted upon by an outside stimulus) become oxidized.

Photoinitiated cationic polymerization of monomers, such as epoxides and vinyl ethers, plays a necessary role in hybrid cure additive fabrication applications. Because of the additives used in different applications, when targeting a specific spectral sensitivity, the wavelength flexibility of photoinitiation becomes a fundamental factor in determining the curing performance of specific formulations. Therefore, photoinitiating systems for cationic polymerization that are sensitive particularly to longer wavelengths, such as those emitted by modern UV/vis optics, are increasingly important. Many of the existing photoinitiating systems for cationic polymerization are based on the use of certain onium salts, such as diphenyliodonium, triphenylsulfonium, and alkoxypyridinium salts. However, these salts do not absorb significantly (if at all) in the UV/vis spectral region unless additional chromophores are incorporated into the salt structure. Therefore, it is important to find alternative ways to synthetically extend the sensitivity range of easily available onium salts to UV/vis wavelengths, especially in light of the fact that commercially-available photoinitiators that are already designed to absorb in the UV/vis spectra are unsuitable for incorporation into hybrid cure systems for additive fabrication for other reasons.

As discussed herein, Inventors have at least partially achieved this with the aid of a combination of sensitizers via a mechanism called indirect excitation. Additionally, onium salts act as electron acceptors in redox reactions with free radicals, electron donor compounds in charge transfer complexes, and long-living electronically excited states of sensitizers, respectively. Among these approaches, so-called "free radical promoted" cationic polymerization seems to be an additional effective and flexible way to generate cationic species capable of initiating the cationic polymerization of monomers. The overall mechanism involves oxidation of photochemically formed radicals by onium salts (On+) with suitable reduction potentials:

$$R\cdot + On^+ \rightarrow R^+ + On\cdot \qquad (1)$$

A non-limiting list of suitable reductants for facilitating free radical promoted cationic polymerization generally includes amines, benzoin and its derivatives, acylphosphine oxides, alkyl-, aryl-, or acyl-substituted germanium compounds, o-phthalaldehyde, vinyl halides, and polysilanes. Many of the free-radical photoinitiators as discussed herein, in particular the relevant Norrish Type I free-radical photoinitiators, can be used additionally or alternatively as suitable reductants.

Amines are considered to be efficient hydrogen donors, and by virtue of chain transfer mechanisms will readily form free-radicals which will reduce a cationic photoinitiator with which they are associated. Therefore, in certain embodiments, they can act as suitable reductants. However, caution needs to be taken when including such compounds in hybrid radiation curable compositions for additive fabrication because of the known tendency for their included nitrogen atom to otherwise inhibit cationic polymerization reactions.

There exist several systems to generate oxidizable radicals in the presence of UV/vis light sources. For instance, radicals formed by the irradiation of systems containing a xanthene dye and an aromatic amine can serve as reductants to a diphenyliodonium salt. Similarly, the dimanganese decacarbonyl-organic halide combination is an efficient reductant for cationic polymerization at UV/vis wavelengths when used in conjunction with onium salts. Additionally, a commercial titanocene type photoinitiator, such as Irgacure 784, can be used as a reductant source generated by irradiation with visible light.

Acylphosphine oxides and acylphosphanates with different structures have been used as photoinitiators for free radical polymerization. Extensive investigations on the photochemistry of acylphosphine oxides revealed that they undergo a cleavage with fairly high quantum yields.

In an embodiment, acylphosphine oxides are suitable reductants to promote the cationic polymerization of appropriate monomers at UV/vis wavelengths. Cationic polymerizations of tetrahydrofuran and butyl vinyl ether can be readily initiated upon irradiation in the presence of bisacylphosphine oxide and diphenyliodonium salt at UV/vis wavelengths. It is believed, without wishing to be bound by theory, that photoinitiated bisacylphosphine oxide readily abstracts hydrogen from appropriate donors (e.g. solvent or monomer), thereby making it a reductant when used with a cationic photoinitiator. The resulting carbon centered radicals are converted to carbocations by reaction with PhI+ ions, which initiate the cationic polymerization. As disclosed herein, acylphosphine oxides and, more preferably substituted acylphosphine oxides, in combination with suitable onium salts, such as iodonium and pyridinium salts, have been found to be efficient and effective reductants for facilitating free cationic polymerization at UV/vis curing wavelengths. The proposed initiation mechanism seems to involve the photogeneration of phosphinoyl radicals and benzoyl radicals in the first step. Subsequent oxidation of phosphinoyl radicals by onium salts yield phosphonium ions capable of initiating the polymerization of monomers. The efficiency of the latter step should be controlled by the redox potential of the onium salt and electron delocalization (p-character) of the phosphinoyl radical. One embodiment of this invention, therefore, is to maximize the redox potential between the onium salt and acylphosphine oxide free radical photoinitiator while also seeking an acyl phosphine oxide that has maximum electron delocalization (p-character) such that the impact of this mechanism is maximized at 400 nm wavelength light and maximum cationic cure speed is realized.

The reductant may comprise two or more compounds. Applicants have surprisingly found that an effective amount of a Norrish Type I photoinitiator, including an alkyl-, aryl-, or acyl-substituted germanium compound, when dissolved in a vinyl ether compound that is liquid at 25 degrees C., serves as a particularly suitable reductant for facilitating the generation of active cations, particularly when paired with an onium, including an iodonium, salt cationic photoinitiator.

The liquid radiation curable resin for additive fabrication can include any suitable amount of a reductant for reducing the cationic photoinitiator, for example, in certain embodiments, in an amount from 0.01 to 30 wt. % in certain embodiments, in an amount from 0.01 to 10 wt. % of the resin composition in other preferred embodiments, in other certain embodiments, from about 1 to about 8 wt. % of the resin composition, and in further embodiments from about 2 to about 6 wt. % of the resin composition. In an embodiment, the above ranges are particularly suitable for use with iodonium salt photoinitiators. In an embodiment, the same reductant component may simultaneously serve as a free-radical photoinitiator and reductant, thereby simultaneously promoting both free-radical polymerization and cationic polymerization. In another embodiment, the reductant may be employed in an amount of from about 0.05% to about 4% by weight of the total composition to which it is incorporated.

Accelerators and/or Compounds Having an Electron-Donating Substituent Attached to a Vinyl Group The additional inclusion of a component possessing an electron-donating substituent attached to a vinyl group may also be used in compositions according to the current invention. Such components, which can be called accelerators, can further provide a mechanism by which to improve the cationic cure of liquid radiation curable compositions for additive fabrication systems employing UV/vis optics. Specifically, Inventors have surprisingly further found that the inclusion of an additional component possessing an electron-donating substituent attached to a vinyl group synergistically improves the rate and/or amount of polymerization when accompanied by the presence of other components inducing other reaction mechanisms cited herein, such as appropriate Norrish Type I photoinitiators, photosensitizers and/or reductants.

One preferred example of a component possessing an electron-donating substituent attached to a vinyl group is vinyl ether. Vinyl ethers can be created from a variety of starting materials such as ethers, esters or biscarbamates, or vinyl ether terminated (poly) urethane or carbonates. Some non-limiting examples of each are included below:

The vinyl ether can include a vinyl ether monomers from ethers. Specific examples of these include polyfunctional vinyl ethers, further including divinyl ethers such as ethylene glycol divinyl ether, diethylene glycol divinyl ether, triethylene glycol divinyl ether, polyethylene glycol divinyl ether, propylene glycol divinyl ether, dipropylene glycol divinyl ether, isobutyl vinyl ether, butylene glycol divinyl ether, butanediol divinyl ether, hexanediol divinylether, cyclohexanediol divinyl ether, bisphenol A alkylene oxide divinyl ether, and bisphenol F alkylene oxide divinyl ether; and polyfunctional vinyl ethers such as trimethylolethane trivinyl ether, trimethylolpropane trivinyl ether, ditrimethylolpropane tetravinyl ether, glycerol trivinyl ether, pentaerythritol tetravinyl ether, pentaerythritol divinyl ether dipentaerythritol pentavinyl ether, dipentaerythritol hexavinyl ether, an ethylene oxide adduct of trimethylolpropane trivinyl ether, a propylene oxide adduct of trimethylolpropane trivinyl ether, an ethylene oxide adduct of ditrimethylolpropane tetravinyl ether, a propylene oxide adduct of ditrimethylolpropane tetravinyl ether, an ethylene oxide adduct of pentaerythritol tetravinyl ether, an propylene oxide adduct of pentaerythritol tetravinyl ether, an ethylene oxide adduct of dipentaerythritol hexavinyl ether, an propylene oxide adduct of dipentaerythritol hexavinyl ether.

The vinyl ether monomer can also be derived from biscarbamate. Examples include polyfunctional vinyl ethers such as divinyl adipate, divinyl terephthalate, divinyl cyclohexyl dicaroxylate. Bis[4-(vinyloxy)butyl] adipate (VEctomer®4060), bis[4-(vinyloxy)butyl] succinate (VEctomer®4030), bis[4-(vinyloxy)butyl] isophthalte (VEctomer®4010), bis[4-(vinyloxymethyl)cyclohexylmethyl] glutarate (VEctomer®4020), tris[4-(vinyloxy)butyl] trimellitate (VEctomer®5015), bis[4-(vinyloxymethyl)cyclohexylmethyl] isophthalate (VEctomer®4040), bis[4-(vinyloxy)butyl](4-methyl-1,3-phenylene) biscarbamate (VEctomer®4220) and bis[4-(vinyloxy)butyl] (methylenedi-4,1-phenylene) biscarbamate (VEctomer®4210) etc.

The vinyl ether may also be a vinyl ether terminated urethane or carbonate. Specific examples include polyfunctional vinylethers, such as polyurethane or polycarbonate endcapped with a hydroxy vinyl ether in which at least both a hydroxyl group and a vinyl ether group are included in the same molecule. Examples include 2-hydroxyethyl vinyl ether, 3-hydroxypropyl vinyl ether, 2-hydroxypropyl vinyl ether, 2-hydroxy isopropylvinyl ether, 4-hydroxybutyl vinyl ether, 3-hydroxybutylvinyl ether, 2-hydroxybutylvinyl ether, 3-hydroxy isobutyl vinyl ether, 2-hydroxy isobutyl vinyl ether, 1-methyl-3-hydroxypropyl vinyl ether, 1-methyl-2-hydroxypropyl vinyl ether, 1-hydroxy methylpropyl vinyl ether, 4-hydroxycyclohexylvinyl ether, 1,6-hexanediol monovinyl ether, 1,4-cyclohexane dimethanol monovinyl ether, 1,3-cyclohexane dimethanol monovinyl ether, 1,2-cyclohexane dimethanol monovinyl ether, p-xylene glycol monovinyl ether, m-xylene glycol monovinyl ether, o-xylene glycol monovinyl ether, diethylene-glycol monovinyl ether, Triethylene glycol monovinyl ether, tetraethylene glycol monovinyl ether, Pentaethylene glycol monovinyl ether, oligo ethylene glycol monovinyl ether, Polyethylene-glycol monovinyl ether, dipropylene glycol monovinyl ether, Tripropylene glycol monovinyl ether, tetrapropylene glycol monovinyl ether. These derivatives, such as pentapropylene glycol monovinyl ether, oligo propylene glycol monovinyl ether, and polypropylene-glycol monovinyl ether, to name a non-limiting list.

In a preferred embodiment, the accelerator or component possessing an electron-donating substituent attached to a vinyl group is one or more of the following: vinyl ether, vinyl ester, vinyl thioether, n-vinyl carbazole, n-vinyl pyrrolidone, n-vinyl caprolactam, allyl ether, and vinyl carbonate.

In another a preferred embodiment, the accelerator or component possessing an electron-donating substituent attached to a vinyl group is multifunctional.

Components possessing an electron-donating substituent attached to a vinyl group such as vinyl ethers have long been known as components to be used in liquid radiation curable compositions for additive fabrication. They have traditionally been used as "passive" network-building polymerizable components. Such components have fallen out of favor in many additive fabrication applications because they are known to undergo co-polymerization; the resulting heterogeneous polymer would be expected to result in inferior physical properties in the associated three-dimensional part, particularly when compared to other more preferred monomers such as cycloaliphatic epoxides, oxetanes, and/or glycidyl ether epoxies. Furthermore, even though such components can be cationically polymerizable, they have a known tendency to induce increased differential shrinkage and/or deformation into the parts into which they are cured, particularly when compared to other cationically polymerizable ring-opening monomers such as epoxides, oxetanes, or oxolanes. Finally, although they are known to be generally faster-curing than many other monomeric components (such as ring-opening monomers such as epoxides or oxetanes), their inclusion is not typically warranted because the overall (cationic) cure will only be as effective as its slowest individual constituent.

Irrespective of their inclusion as a cationically and/or free-radically curable monomer in a radiation curable composition for additive fabrication, vinyl ethers have not been added to compositions to accelerate or promote the additional (or faster) cure of any accompanying cationically curable monomers such as epoxies. Inventors have surprisingly discovered that—especially under certain UV/vis cure conditions—such compounds, when incorporated in photoinitiating packages in accordance with the present invention, serve to facilitate the significant improvement of the rate and/or amount of polymerization of accompanying cationically curable components such as epoxides or oxetanes. This enables the rapid production of three-dimensional components produced via additive fabrication processes utilizing UV/vis optics with resulting parts possessing excellent green strength and robust mechanical properties that would not otherwise be possible according to known methods of formulation.

Inventors have surprisingly also discovered that in order to further promote levels of cationic polymerization (via the facilitation of the generation of more cations), it is useful to select an accelerator or component possessing an electron-donating substituent attached to a vinyl group that is capable of forming a vinyl-based or ether radical which readily acts to reduce the cationic photoinitiator (preferably an iodonium salt). Molecular modeling under B3LYP/6-31G(d) in combination with Koopman's Theorem is useful to enable the calculation of the ionization potentials of various radicals known to be associated with one or more electron-donating substituents attached to a vinyl group (such as, but not limited to trifluoromethyl vinyl ether, vinyl acetate, tris (trimethylsilyl)silyl vinyl ether, vinyl thioether, and vinyl ether). These values, although expressed herein in terms of the same units as the ionization potential of the Norrish Type I photoinitiators' excited triplet states and the ionization potential of the radicals formed therefrom (electron volts or eV), should not be compared directly thereto. Instead, such values are useful only to be considered relative to each other.

In a preferred embodiment, therefore, accelerators or compounds having an electron-donating substituent attached to a vinyl group are chosen that are known to be configured to form a radical with a calculated ionization potential of less than or equal to 6.58 eV, more preferably less than 5.42 eV, more preferably less than 4.89 eV, more preferably less than 4.30 eV, more preferably less than 4.20 eV, as calculated via molecular modeling under B3LYP/6-31G(d). Furthermore, in a preferred embodiment, accelerators or compounds having an electron-donating substituent attached to a vinyl group are chosen such that they are known to be configured to form a radical with a calculated ionization potential of at least 3.3 eV, more preferably at least 3.5 eV, more preferably 3.8 eV.

Irrespective of their reason for use, one or more of the aforementioned accelerators or components possessing an electron-donating substituent attached to a vinyl group can be employed in compositions according to the present invention in any suitable amount, and may be chosen singly or in combination of one or more of the types enumerated herein. In a preferred embodiment, the accelerator or component possessing an electron-donating substituent attached to a vinyl group is present in an amount, relative to the entire weight of the composition, of from about 1 wt. % to about 25 wt. %, more preferably from about 5 wt. % to about 20 wt. %, more preferably about 5 wt. % to about 12 wt. %. In another embodiment, the accelerator or component possessing an electron-donating substituent attached to a vinyl group is present in an amount from 1 wt. % to 15 wt. %, more preferably from 1 wt. % to 10 wt. %, more preferably from 3 wt. % to about 8 wt. %. In another embodiment, the accelerator or component possessing an electron-donating substituent attached to a vinyl group may be used in an amount of more than 0.5%, or more than 1.0%, or more than 1.5%, or more than 2.5%, or more than 3%, up to less than 20 wt. %, more preferably less than 15 wt. %, or less than 10 wt. %, or less than 5 wt. %, relative to the weight of the entire composition into which they are incorporated.

Photoinitiating Package Ratios

Inventors have found that compositions according to the present invention may become particularly optimized for curing via certain additive fabrication processes utilizing UV/vis optics if ratios of the various required components are controlled relative to each other. In an embodiment, therefore, the molar ratio of the iodonium salt cationic photoinitiator to one or more of the reductant, accelerator, or component possessing an electron-donating substituent attached to a vinyl group is from 2:1 to 1:50, more preferably from 1:1 to 1:30, or from 1:2 to 1:20, or from 1:5 to 1:10.

In an embodiment, the molar ratio of the Norrish Type I photoinitiator to one or more of the reductant, accelerator, or component possessing an electron-donating substituent attached to a vinyl group is from 2:1 to 1:50, more preferably from 1:1 to 1:30, or from 1:2 to 1:20, or from 1:5 to 1:10.

In an embodiment, the molar ratio of the iodonium salt cationic photoinitiator to the Norrish Type I photoinitiator is from 1:4 to 4:1 more preferably from 1:2 to 2:1, or from 3:4 to 4:3.

If the amount of the iodonium salt cationic photoinitiator becomes too large, the incremental improvement in cure performance eventually becomes negligible, and is outweighed by the added cost, impeding the practicality of formulating a cost-efficient composition. If it becomes too low relative to the other constituents, cationic cure is not initiated to required levels to produce a three-dimensional part with adequate green strength. The amount of the Norrish Type I photoinitiator should not significantly vary relative to the amount of the cationic photoinitiator, although it should be present in an amount sufficient to enable both direct polymerization of the free-radically polymerizable constituent and the indirect excitation of said cationic photoinitiator.

The accelerator or component possessing an electron-donating substituent attached to a vinyl group should be present in an amount sufficient to facilitate the free-radically promoted cationic polymerization and/or relevant oxidation/reduction reactions of the cationic photoinitiator. Finally, the accelerator or component possessing an electron-donating substituent attached to a vinyl group can be present in the greatest molar amount relative to the aforementioned other constituents in a photoinitiating package to sufficiently enable additional cationic polymerization mechanisms, but it should not be present in an excessive amount in order that the mechanical properties of the three-dimensional cured part made therefrom are not hindered.

Cationically Curable Constituent

In accordance with an embodiment, the liquid radiation curable resins for additive fabrication of the invention comprise at least one cationically polymerizable component; that is a component which undergoes polymerization initiated by cations or in the presence of acid generators. The cationically polymerizable components may be monomers, oligomers, and/or polymers, and may contain aliphatic, aromatic, cycloaliphatic, arylaliphatic, heterocyclic moiety(ies), and any combination thereof. Preferably, the cationically polymerizable component includes at least one cycloaliphatic compound. Suitable cyclic ether compounds can comprise cyclic ether groups as side groups or groups that form part of an alicyclic or heterocyclic ring system.

The cationic polymerizable component is selected from the group consisting of cyclic ether compounds, cyclic acetal compounds, cyclic thioethers compounds, spiro-orthoester compounds, cyclic lactone compounds, and vinyl ether compounds, and any combination thereof.

Suitable cationically polymerizable components include cyclic ether compounds such as epoxy compounds and oxetanes, cyclic lactone compounds, cyclic acetal compounds, cyclic thioether compounds, and spiro-orthoester compounds. Specific examples of cationically polymerizable components include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resins, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexanecarboxylate, 2-(3,4-epoxycyclohexyl-5,5-spiro-3,4-epoxy)-cyclohexane-1,4-dioxane, bis(3,4-epoxycyclohexylmethyl)adipate, vinylcyclohexene oxide, 4-vinylepoxycyclohexane, vinylcyclohexene dioxide, limonene oxide, limonene dioxide, bis(3,4-epoxy-6-methylcyclohexylmethyl)adipate, 3,4-epoxy-6-methylcyclohexyl-3',4'-epoxy-6'-methylcyclohexanecarboxylate, ε-caprolactone-modified 3,4-epoxycyclohexylmethyl-3',4'-epoxycyclohexane carboxylates, trimethylcaprolactone-modified 3,4-epoxycyclohexylmethyl-3',4'-epoxycyclohexane carboxylates, β-methyl-δ-valerolactone-modified 3,4-epoxycyclohexylmethyl-3',4'-epoxycyclohexane carboxylates, methylenebis(3,4-epoxycyclohexane), bicyclohexyl-3,3'-epoxide, bis(3,4-epoxycyclohexyl) with a linkage of —O—, —S—, —SO—, —SO$_2$—, —C(CH$_3$)$_2$—, —CBr$_2$—, —C(CBr$_3$)$_2$—, —C(CF$_3$)$_2$—, —C(CCl$_3$)$_2$—, or —CH(C$_6$H$_5$)—, dicyclopentadiene diepoxide, di(3,4-epoxycyclohexylmethyl) ether of ethylene glycol, ethylenebis(3,4-epoxycyclohexanecarboxylate), epoxyhexahydrodioctylphthalate, epoxyhexahydro-di-2-ethylhexyl phthalate, 1,4-butanediol diglycidyl ether, 1,6-hexanediol diglycidyl ether, neopentylglycol diglycidyl ether, glycerol triglycidyl ether, trimethylolpropane triglycidyl ether, polyethylene glycol diglycidyl ether, polypropylene glycol diglycidyl ether, diglycidyl esters of aliphatic long-chain dibasic acids, monoglycidyl ethers of aliphatic higher alcohols, monoglycidyl ethers of phenol, cresol, butyl phenol, or polyether alcohols obtained by the addition of alkylene oxide to these compounds, glycidyl esters of higher fatty acids, epoxidated soybean oil, epoxybutylstearic acid, epoxyoctylstearic acid, epoxidated linseed oil, epoxidated polybutadiene, 1,4-bis[(3-ethyl-3-oxetanylmethoxy)methyl]benzene, 3-ethyl-3-hydroxymethyloxetane, 3-ethyl-3-(3-hydroxypropyl)oxymethyloxetane, 3-ethyl-3-(4-hydroxybutyl)oxymethyloxetane, 3-ethyl-3-(5-hydroxypentyl)oxymethyloxetane, 3-ethyl-3-phenoxymethyloxetane, bis((1-ethyl(3-oxetanyl))methyl)ether, 3-ethyl-3-((2-ethylhexyloxy)methyl)oxetane, 3-ethyl-((triethoxysilylpropoxymethyl)oxetane, 3-(meth)-allyloxymethyl-3-ethyloxetane, 3-hydroxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]-benzene, [1-(3-ethyl-3-oxetanylmethoxy)ethyl]phenyl ether, isobutoxymethyl(3-ethyl-3-oxetanylmethyl)ether, 2-ethylhexyl(3-ethyl-3-oxetanylmethyl)ether, ethyldiethylene glycol(3-ethyl-3-oxetanylmethyl)ether, dicyclopentadiene (3-ethyl-3-oxetanylmethyl)ether, dicyclopentenyloxyethyl (3-ethyl-3-oxetanylmethyl)ether, dicyclopentenyl(3-ethyl-3-oxetanylmethyl)ether, tetrahydrofurfuryl(3-ethyl-3-oxetanylmethyl)ether, 2-hydroxyethyl(3-ethyl-3-oxetanylmethyl) ether, 2-hydroxypropyl(3-ethyl-3-oxetanylmethyl)ether, and any combination thereof.

The cationically polymerizable component may optionally also contain polyfunctional materials including dendritic polymers such as dendrimers, linear dendritic polymers, dendrigraft polymers, hyperbranched polymers, star branched polymers, and hypergraft polymers with epoxy or oxetane functional groups. The dendritic polymers may contain one type of polymerizable functional group or different types of polymerizable functional groups, for example, epoxy and oxetane functions.

In an embodiment, the composition of the present invention also comprises one or more mono or poly glycidylethers of aliphatic alcohols, aliphatic polyols, polyesterpolyols or polyetherpolyols. Examples of preferred components include 1,4-butanedioldiglycidylether, glycidylethers of polyoxyethylene and polyoxypropylene glycols and triols of molecular weights from about 200 to about 10,000; glycidylethers of polytetramethylene glycol or poly(oxyethyleneoxybutylene) random or block copolymers. In a specific embodiment, the cationically polymerizable component comprises a polyfunctional glycidylether that lacks a cyclohexane ring in the molecule. In another specific embodiment, the cationically polymerizable component includes a neopentyl glycol diglycidyl ether. In another specific embodiment, the cationically polymerizable component includes a 1,4 cyclohexanedimethanol diglycidyl ether.

Examples of commercially available preferred polyfunctional glycidylethers are Erisys™ GE 22 (Erisys™ products are available from Emerald Performance Materials™), Heloxy™ 48, Heloxy™ 67, Heloxy™ 68, Heloxy™ 107 (Heloxy™ modifiers are available from Momentive Specialty Chemicals), and Grilonit® F713. Examples of commercially available preferred monofunctional glycidylethers are Heloxy™ 71, Heloxy™ 505, Heloxy™ 7, Heloxy™ 8, and Heloxy™ 61.

In an embodiment, the epoxide is 3,4-epoxycyclohexylmethyl-3',4-epoxycyclohexanecarboxylate (available as CELLOXIDE™ 2021P from Daicel Chemical, or as CYRACURE™ UVR-6105 from Dow Chemical), hydrogenated bisphenol A-epichlorohydrin based epoxy resin (available as EPON™ 1510 from Momentive), 1,4-cyclohexanedimethanol diglycidyl ether (available as HELOXY™ 107 from Momentive), a hydrogenated bisphenol A diglycidyl ether (available as EPON™ 825 from Momentive) a mixture of dicyclohexyl diepoxide and nanosilica (available as NANOPOX™), and any combination thereof.

In a specific embodiment, the cationic polymerizable component includes a cycloaliphatic epoxy, for example, a cycloaliphatic epoxy with 2 or more than 2 epoxy groups according to the following formula:

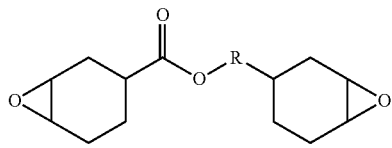

wherein R is a carbon atom, an ester-containing $C_1$-$C_{10}$ aliphatic chain, or a $C_1$-$C_{10}$ alkyl chain.

In another specific embodiment, the cationic polymerizable component includes an epoxy having an aromatic or aliphatic glycidyl ether group with 2 (difunctional) or more than 2 (polyfunctional) epoxy groups.

The above-mentioned cationically polymerizable compounds can be used singly or in combination of two or more thereof. In embodiments of the invention, the cationic polymerizable component further comprises at least two different epoxy components.

In other embodiments of the invention, the cationic polymerizable component also comprises an oxetane component. In a specific embodiment, the cationic polymerizable component includes an oxetane, for example, an oxetane containing 1, 2 or more than 2 oxetane groups. In another embodiment, the oxetane employed is monofunctional, and additionally possesses a hydroxyl group. According to an embodiment, the oxetane possesses the following structure:

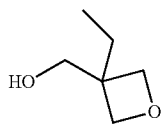

If utilized in the composition, the oxetane component is present in a suitable amount from about 5 to about 50 wt. % of the resin composition. In another embodiment, the oxetane component is present in an amount from about 10 to about 25 wt. % of the resin composition, and in yet another embodiment, the oxetane component is present in an amount from 20 to about 30 wt. % of the resin composition.

The liquid radiation curable resin for additive fabrication can therefore include suitable amounts of the cationic polymerizable component, for example, in certain embodiments, in an amount from about 10 to about 80% by weight of the resin composition, in further embodiments from about 20 to about 70 wt. % of the resin composition, and in further embodiments from about 25 to about 65 wt. % of the resin composition.

Free-Radically Polymerizable Component

In accordance with an embodiment of the invention, the liquid radiation curable resin for additive fabrication of the invention comprises at least one free-radical polymerizable component, that is, a component which undergoes polymerization initiated by free radicals. The free-radical polymerizable components are monomers, oligomers, and/or polymers; they are monofunctional or polyfunctional materials, i.e., have 1, 2, 3, 4, 5, 6, 7, 8, 9, 10 . . . 20 . . . 30 . . . 40 . . . 50 . . . 100, or more functional groups that can polymerize by free radical initiation, may contain aliphatic, aromatic, cycloaliphatic, arylaliphatic, heterocyclic moiety(ies), or any combination thereof. Examples of polyfunctional materials include dendritic polymers such as dendrimers, linear dendritic polymers, dendrigraft polymers, hyperbranched polymers, star branched polymers, and hypergraft polymers; see, e.g., US 2009/0093564 A1. The dendritic polymers may contain one type of polymerizable functional group or different types of polymerizable functional groups, for example, acrylates and methacrylate functions.

Examples of free-radical polymerizable components include acrylates and methacrylates such as isobornyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, benzyl (meth)acrylate, 4-butylcyclohexyl (meth)acrylate, acryloyl morpholine, (meth)acrylic acid, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, caprolactone acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, tridecyl (meth)acrylate, undecyl (meth)acrylate, lauryl (meth)acrylate, stearyl (meth)acrylate, isostearyl (meth)acrylate, tetrahydrofurfuryl (meth)acrylate, butoxyethyl (meth)acrylate, ethoxydiethylene glycol (meth)acrylate, benzyl (meth)acrylate, phenoxyethyl (meth)acrylate, polyethylene glycol mono (meth)acrylate, polypropylene glycol mono(meth)acrylate, methoxyethylene glycol (meth)acrylate, ethoxyethyl (meth)acrylate, methoxypolyethylene glycol (meth)acrylate, methoxypolypropylene glycol (meth)acrylate, diacetone (meth)acrylamide, beta-carboxyethyl (meth)acrylate, phthalic acid (meth)acrylate, dimethylaminoethyl (meth)acrylate, diethylaminoethyl (meth)acrylate, butylcarbamylethyl (meth)acrylate, n-isopropyl (meth)acrylamide fluorinated (meth)acrylate, 7-amino-3,7-dimethyloctyl (meth)acrylate.

Examples of polyfunctional free-radical polymerizable components include those with (meth)acryloyl groups such as trimethylolpropane tri(meth)acrylate, pentaerythritol (meth)acrylate, ethylene glycol di(meth)acrylate, bisphenol A diglycidyl ether di(meth)acrylate, dicyclopentadiene dimethanol di(meth)acrylate, [2-[1,1-dimethyl-2-[(1-oxoallyl)oxy]ethyl]-5-ethyl-1,3-dioxan-5-yl]methyl acrylate; 3,9-bis(1,1-dimethyl-2-hydroxyethyl)-2,4,8,10-tetraoxaspiro [5.5]undecane di(meth)acrylate; dipentaerythritol monohydroxypenta(meth)acrylate, propoxylated trimethylolpropane tri(meth)acrylate, propoxylated neopentyl glycol di(meth)acrylate, tetraethylene glycol di(meth)acrylate, polyethylene glycol di(meth)acrylate, 1,4-butanediol di(meth)acrylate, 1,6-hexanediol di(meth)acrylate, neopentyl glycol di(meth)acrylate, polybutanediol di(meth)acrylate, tripropyleneglycol di(meth)acrylate, glycerol tri(meth)acrylate, phosphoric acid mono- and di(meth)acrylates, $C_7$-$C_{20}$ alkyl di(meth)acrylates, tris(2-hydroxyethyl)isocyanurate tri (meth)acrylate, tris(2-hydroxyethyl)isocyanurate di(meth) acrylate, pentaerythritol tri(meth)acrylate, pentaerythritol tetra(meth)acrylate, dipentaerythritol hexa(meth)acrylate, tricyclodecane diyl dimethyl di(meth)acrylate and alkoxylated versions (e.g., ethoxylated and/or propoxylated) of any of the preceding monomers, and also di(meth)acrylate of a diol which is an ethylene oxide or propylene oxide adduct to bisphenol A, di(meth)acrylate of a diol which is an ethylene oxide or propylene oxide adduct to hydrogenated bisphenol A, epoxy (meth)acrylate which is a (meth)acrylate adduct to bisphenol A of diglycidyl ether, diacrylate of polyoxyalkylated bisphenol A, and triethylene glycol divinyl ether, and adducts of hydroxyethyl acrylate.

In accordance with an embodiment, the radically polymerizable component is a polyfunctional (meth)acrylate. The polyfunctional (meth)acrylates may include all methacryloyl groups, all acryloyl groups, or any combination of methacryloyl and acryloyl groups. In an embodiment, the free-radical polymerizable component is selected from the group consisting of bisphenol A diglycidyl ether di(meth)acrylate, ethoxylated or propoxylated bisphenol A or bisphenol F di(meth)acrylate, dicyclopentadiene dimethanol di(meth) acrylate, [2-[1,1-dimethyl-2-[(1-oxoallyl)oxy]ethyl]-5-ethyl-1,3-dioxan-5-yl] methyl acrylate, dipentaerythritol monohydroxypenta(meth)acrylate, dipentaerythritol penta (meth)acrylate, dipentaerythritol hexa(meth)acrylate, propoxylated trimethylolpropane tri(meth)acrylate, and propoxylated neopentyl glycol di(meth)acrylate, and any combination thereof.

In an embodiment, the polyfunctional (meth)acrylate has more than 2 functional groups. According to another embodiment, the polyfunctional (meth)acrylate has more than 3 functional groups. In yet another embodiment, the polyfunctional (meth)acrylate has more than 4 functional groups. In another preferred embodiment, the radically polymerizable component consists exclusively of a single polyfunctional (meth)acrylate component. In further embodiments, the exclusive radically polymerizable component is tetra-functional, in further embodiments, the exclusive radically polymerizable component is penta-functional, and in further embodiments, the exclusive radically polymerizable component is hexa-functional.

In another embodiment, the free-radical polymerizable component contains an aromatic (meth)acrylate. Aromatic acrylates may be derived from, as non-limiting examples, bisphenol-A, bisphenol-S, or bisphenol-F. In certain embodiments the aromatic selected from the group consisting of bisphenol A diglycidyl ether diacrylate, dicyclopentadiene dimethanol diacrylate, [2-[1,1-dimethyl-2-[(1-oxoallyl)oxy]ethyl]-5-ethyl-1,3-dioxan-5-yl]methyl acrylate, dipentaerythritol monohydroxypentaacrylate, propoxylated trimethylolpropane triacrylate, and propoxylated neopentyl glycol diacrylate, and any combination thereof. In an embodiment, the aromatic (meth)acrylate is difunctional.

In specific embodiments, the liquid radiation curable resins for additive fabrication of the invention include one or more of bisphenol A diglycidyl ether di(meth)acrylate, dicyclopentadiene dimethanol di(meth)acrylate, dipentaerythritol monohydroxypenta(meth)acrylate, propoxylated trimethylolpropane tri(meth)acrylate, and/or propoxylated neopentyl glycol di(meth)acrylate, and more specifically one or more of bisphenol A diglycidyl ether diacrylate, dicyclopentadiene dimethanol diacrylate, dipentaerythritol pentaacrylate, propoxylated trimethylolpropane triacrylate, and/or propoxylated neopentyl glycol diacrylate.

The above-mentioned radically polymerizable compounds can be used singly or in combination of two or more thereof. The liquid radiation curable resin for additive fabrication can include any suitable amount of the free-radical polymerizable components, for example, in certain embodiments, in an amount up to about 50 wt. % of the resin composition, in certain embodiments, from about 2 to about 40 wt. % of the resin composition, in other embodiments from about 5 to about 30 wt. %, and in further embodiments from about 10 to about 20 wt. % of the resin composition.

Optional Additives

Compositions according to the present invention may optionally include one or more additives. Stabilizers are often added to the resin compositions as additives in order to further prevent a viscosity build-up, for instance a viscosity build-up during usage in a solid imaging process. Useful stabilizers include those described in U.S. Pat. No. 5,665,792. The presence of a stabilizer is optional. In a specific embodiment, the liquid radiation curable resin composition for additive fabrication comprises from 0.1 wt. % to 3% of a stabilizer.

Other possible additives include organic and inorganic fillers, dyes, pigments, antioxidants, wetting agents, bubble breakers, chain transfer agents, leveling agents, defoamers, surfactants and the like. Such additives are known and can be generally employed as is desirable for a particular application, as will be appreciated by one of ordinary skill in the art.

The liquid radiation curable resin composition for additive fabrication of the invention can further include one or more additives selected from the group consisting of bubble breakers, antioxidants, surfactants, acid scavengers, pigments, dyes, thickeners, flame retardants, silane coupling agents, ultraviolet absorbers, resin particles, core-shell particle impact modifiers, soluble polymers and block polymers.

Additionally, many of the known liquid radiation curable resin compositions for additive fabrication use hydroxy-functional compounds to enhance the properties of the parts made from the resin compositions. If present, any hydroxy group may be employed for the particular purpose. If present, the hydroxyl-containing material preferably contains one or more primary or secondary aliphatic hydroxyl. The hydroxyl group may be internal in the molecule or terminal. Monomers, oligomers or polymers can be used. The hydroxyl equivalent weight, i.e., the number average molecular weight divided by the number of hydroxyl groups, is preferably in the range of 31 to 5000. If present, the resin composition preferably comprises, relative to the total weight of the resin composition, at most 10 wt. % of one or more non-free radical polymerizable hydroxy-functional compounds, or at most 5 wt. %, or at most 2 wt. %.

A third embodiment is a method of forming a three-dimensional article via an additive fabrication system utilizing UV/vis optics, the method comprising:
(1) providing the liquid radiation curable composition for additive fabrication according to any aspects of the first or second embodiments;
(2) establishing a first liquid layer of the liquid radiation curable resin;
(3) exposing the first liquid layer imagewise to actinic radiation via a UV/vis optics configuration to form an imaged cross-section, thereby forming a first cured layer;
(4) forming a new layer of liquid radiation curable resin in contact with the first cured layer;
(5) exposing said new layer imagewise to actinic radiation to form an additional imaged cross-section; and
(6) repeating steps (4) and (5) a sufficient number of times in order to build up a three-dimensional article;
wherein the UV/vis optics emit radiation at a peak spectral intensity from about 375 nm to about 500 nm, more preferably from about 380 nm to about 450 nm, more preferably from about 390 nm to about 425 nm, more preferably from about 395 nm to about 410 nm.

The liquid radiation curable composition provided in the third embodiment described above is suitable for cure via additive fabrication systems utilizing UV/vis optics. Such compositions are described elsewhere herein, supra. In establishing a first liquid layer or forming a new layer of the liquid radiation curable resin, a layer may be of any suitable thickness and shape, and is dependent on the additive fabrication process utilized. For example, it may be selectively dispensed via jetting, or it may be added by dipping the previously cured layer into a vat of resin, producing a layer of substantially uniform thickness, as is typical with most stereolithography processes. It another non-limiting embodiment, it may alternatively be transferred via a foil, film or carrier in a predefined thickness via a cartridge or dispenser.

In the above, "exposing" refers to irradiating with actinic radiation. As noted previously, the inventive liquid radiation compositions for additive fabrications as described herein are particularly suitable for imparting hybrid cure via UV/vis optics. In an embodiment, the UV/vis optics utilize one or more LEDs as a light source. In an embodiment, the light source is a laser. In an embodiment, the LED or laser light source is coupled to a DLP or LCD image projection system. In an embodiment wherein the image projection systems includes an LCD display, the light source may be configured to emit actinic radiation exclusively above 400 nm, to minimize the detrimental effect UV wavelengths have upon LCD componentry.

A fourth embodiment is the three-dimensional part formed by the third embodiment using the radiation curable compositions according to any aspect of the first or second embodiments.

The following examples further illustrate the invention but, of course, should not be construed as in any way limiting its scope.

EXAMPLES

These examples illustrate embodiments of the liquid radiation curable resins for additive fabrication of the instant invention. Table 1 describes the various components of the liquid radiation curable resins for additive fabrication used in the present examples.

TABLE 1

| Component | Function in Formula | Chemical Descriptor | Supplier/ Manufacturer |
|---|---|---|---|
| OXT-101 | Cationically polymerizable component | 3-Ethyl-3-hydroxymethyl-oxetane | Toagosei |
| UVR 6105 | Cationically polymerizable component | 3',4'-Epoxycyclohexane)methyl 3,4-epoxycyclohexylcarboxylate | Dow Chemical |
| polyTHF$_{1000}$ | Additive | Polytetramethylene glycol, molecular weight 1000 g/mol | Invista |
| Epon 828 | Cationically polymerizable component | Bisphenol A Diglycidyl Ether | Hexion |
| Ebecryl 3700 | Free-radically polymerizable component | Bisphenol A Diglycidyl Diacrylate | Allnex |
| Irgacure 250 | Photoinitiating package | Solution of 50% Iodonium, (4-methylphenyl)[4-(2-methylpropyl) phenyl]-, hexafluorophosphate and 50% propylene carbonate | BASF |
| Bluesil PI 2074 | Photoinitiating pacakge | [4-(1-methylethyl)phenyl](4-methylphenyl) iodonium tetrakis(pentafluorophenyl)borate | Bluestar Silicones |
| TEGDVE | Photoinitiating package | Triethylene glycol divinylether | BASF |
| Irgacure 819 (BAPO) | Photoinitiating pacakge | bis(2,4,6-trimethylbenzoyl)-phenylphosphineoxide | BASF |
| Ivocerin | Photoinitiating package | bis acyl germanoyl | Synthon Chemicals GmbH |
| BTG | Photointiaiting Package | benzoyl trimethyl germane | DSM |
| Somos ® NeXt | Base Resin | Commercially available proprietary resin for stereolithography | DSM |
| CPTX | Photoinitiating pacakge | 1-chloro-4-propoxythioxanthone | Lambson |

TABLE 1-continued

| Component | Function in Formula | Chemical Descriptor | Supplier/Manufacturer |
|---|---|---|---|
| UVS1101 | Photoinitiating package | 9,10-Diethoxyanthracene | Kawasaki Kasei |
| Lucirin TPO | Photoinitiating package | 2,4,6-trimethylbenzoyl diphenylphosphine oxide | BASF |
| Irgacure 184 | Photoinitiating package | alpha hydroxyl cyclohexyl phenyl ketone | BASF |
| CPI-6976 | Photoinitiating package | A mixture of: bis[4-diphenylsulfoniumphenyl]sulfide bishexafluoroantimonate; thiophenoxyphenylsulfonium hexafluoroantimonate and propylene carbonate. | San-Apro |
| PC | Solvent | Propylene carbonate | Sigma-Aldrich |
| Chivacure BMS | Photoinitiating package | 4-benzoyl-4'-methyl diphenyl sulphide | Chitec |
| Chivacure 1173 | Photoinitiating package | 2-Hydroxy-2-methyl-1-phenyl-propan-1-one | Chitec |
| Chivacure 1176 | Photoinitiating package | A mixture of: bis[4-diphenylsulfoniumphenyl]sulfide bishexafluoroantimonate; thiophenoxyphenylsulfonium hexafluoroantimonate and propylene carbonate. | Chitec/Aceto |

Calculation of Ionization Potentials

The procedure herein was used to derive all ionization potential values. First, the molecular structure of the system of interest was constructed by means of the Spartan 14 software (Spartan '14 Version 1.1.2 Oct. 24, 2013, Copyright © 1991-2013 by Wavefunction Inc). Using the same program, a conformational analysis was conducted employing the Merck Molecular Force Field (MMFF). All MMFF conformations were subsequently minimized using the semi-empirical Parameterization Method 6 (PM6).

All unique conformations resulting from the PM6 optimization runs were exported as .xyz coordinate files which were then used as a starting point to conduct more advanced quantum mechanical calculations at the B3LYP/6-31G(d) level with the Gaussian 09 program (Gaussian 09, Revision C.01, M. J. Frisch, G. W. Trucks, et al., Gaussian, Inc., Wallingford Conn., 2010). The spin-unrestricted wavefunctions for both the radicals and triplet states were then calculated.

All optimization runs were followed by unrestricted B3LYP/6-31G(d) frequency calculations in order to identify whether or not the resulting B3LYP/6-31G(d) structures were true energy minima on the potential energy surface.

The ionization potential (IP) was derived from the results for the global minimum conformation under the assumption of Koopmans' theorem, i.e., the IP were obtained from the energy of the highest occupied molecular orbital (HOMO) as $P = -\varepsilon_{HOMO}$ with the HOMO energies converted from a.u. (Hartree) to electron volts (1 Hartree=27.211383 eV). Values are expressed in terms of electron volts (eV).

The ionization potentials of the triplet states of several known Norrish Type I photoinitiators calculated according to this method are presented below in Table 2. The similarly calculated ionization potentials of known radicals are presented below in Table 3. Finally, the similarly calculated ionization potentials of various components having an electron-donating substituent attached to a vinyl group are presented below in Table 4.

TABLE 2

Calculated Triplet State Ionization Potential of Known Photoinitiators/Photosensitizers (eV)

| | Component | | | | | | |
|---|---|---|---|---|---|---|---|
| | TPO | BAPO | Irgacure 184 | CPTX | BTG | Ivocerin | UVS1101 |
| Value | 4.15 | 3.98 | 3.91 | 3.84 | 3.71 | 3.49 | 3.34 |

TABLE 3

Calculated Ionization Potentials of Known Radicals (eV)

| Radical Structure | Component from which radical is derived | Mechanism of radical formation | Value |
|---|---|---|---|
|  | Ivocerin | Photoinitiator fragments | 4.79 |
|  | Ivocerin | | 4.97 |
|  | BAPO | | 4.81 |

TABLE 3-continued

Calculated Ionization Potentials of Known Radicals (eV)

| Radical Structure | Component from which radical is derived | Mechanism of radical formation | Value |
|---|---|---|---|
| (structure) | BAPO | | 5.65 |
| (structure) | Epon 828 | H-abstraction of labile hydrogens in cationically polymerizable components | 5.34 |
| (structure) | Celloxide 2021P | | 5.06 |
| (structure) | OXT-101 | | 4.76 |
| (structure) | TEGDVE | | 4.19 |
| (structure) | Tetrahydrofuran | | 4.06 |
| (structure) | Ebecryl 3700 | Addition to acrylate | 6.17 |
| (structure) | Ebecryl 3700 | Backbiting from acrylate | 5.68 |
| (structure) | TEGDVE | Addition to vinyl ether | 4.19 |

TABLE 4

Calculated Ionization Potentials of various components having an electron-donating substituent attached to a vinyl group (eV)

| Component | Structure | Value |
|---|---|---|
| Trifluomethyl vinyl ether | (structure) | 5.42 |
| vinyl acetate | (structure) | 4.89 |
| tris(trimethylsilyl) silyl vinyl ether | (structure) | 4.3 |
| vinyl thioether | (structure) | 4.29 |
| vinyl ether | (structure) | 4.19 |

Examples 1-60

First, a base resin for additive fabrication including a cationically polymerizable constituent (further including an oxetane, a cycloaliphatic epoxide, and a glycidyl ether epoxy), a free-radically polymerizable constituent, and a chain transfer agent additive ("Resin Base 1") was prepared according to well-known methods in the art by combining the components listed in Table 5 below.

The cure performance under UV/vis conditions of Resin Base 1 when incorporated with various photoinitiating packages was then evaluated according to the polymerization rate test methodology described below.

A sample plot of the cure performance of two compositions is depicted in FIG. 1. FIG. 1 depicts the cure performance, as represented by the % conversion of a polymerizable component as a function of time. Such conversion could represent the amount of polymerization of the cycloaliphatic epoxide component, the oxetane component, or acrylate component, as non-limiting examples. The data series for composition 1 depicts a high degree of conversion relative to the data series for composition 2. Lines 3 and 4 depict the slope of the least squares fit line of the first three data points generated for each composition, in accordance with the procedure outlined herein. Notably, the slope of line 3 (pertaining to composition 1) is higher than that of the slope of line 4 (pertaining to composition 2); this indicates a faster initial rate of conversion. Vertical line 5 represents a point at which total conversion is sought to be measured specifically. This could be at a critical time for a given composition, such as the time at which it is necessary to form another layer in an additive fabrication process, and at which a certain conversion must be attained for the composition to be effective for use in such a process. As can be seen, composition 1 exhibits a conversion rate at point 6 that is significantly higher than the conversion rate at the same point in time for composition 2 (at point 7).

Reported are various cure speed parameters, which are explained below and are depicted in Tables 6-9. All values are listed in parts by weight unless otherwise denoted.

TABLE 5

| Resin Base 1 | |
|---|---|
| Component\Formula | Resin Base 1 |
| OXT-101 (3-Ethyl-3-hydroxymethyl-oxetane) | 10.5 |
| UVR-6105 ((3',4'-Epoxycyclohexane)methyl 3,4-epoxycyclohexylcarboxylate) | 36.8 |
| PolyTHF-1000 (Polytetramethylene glycol MW1000) | 10.5 |
| E828 (Bisphenol A Diglycidyl Ether) | 21.1 |
| Ebecryl 3700 (Bisphenol A Diglycidyl Diacrylate) | 21.1 |

Test Methodology—Polymerization Rate

To measure polymerization rate (cure speed) of each example, a Real Time Fourier Transform Infrared (FTIR) spectroscopy was used. To increase the data acquisition frequency as well as resolution, a mercury cadmium telluride (MCT) detector was used. Instead of transmission mode, an Attenuated Total Reflection (ATR) setup was used. All polymerization rate measurements were performed using the Thermo Scientific Nicolet 8700 model. The Table below shows the experimental conditions setup for the measurement. Under these conditions, a total of 41 spectra for 200 seconds were obtained for each measurement:

| | |
|---|---|
| Number of scans | 4 |
| Resolution | 4 |
| Data collection type | Real Time |
| Profile type | Ramp |
| Time sequence | Save 200 seconds |
| Use repeat time (sec) | 5 |

For UV/Vis light control, a Digital Light Lab LED spot lamp (400 nm) and controller (AccuCure Photo Rheometer) were used, with the "calibrated continuous mode" selected. The light intensity and duration (light exposure time) were selected before measurement. This was followed for all examples, with the exception of Examples 41-46 (Table 7), wherein a 355 nm solid-state laser was employed.

For measurement, a couple of drops of selected sample are placed in the center of an ATR crystal setup. Then, an approximately 3 mil film (±0.4 mils) was coated on the top of an ATR crystal using a 3 mil (±0.4 mils) draw down bird bar. Immediately after application of the 3 mil coating, the LED lamp was held on the top of ATR setup and positioned at the hole at the center of the hold. Then the real time FTIR scan was initiated. Once one (1) spectrum was obtained, the light source was turned on to start polymerization. Based on the program input above, each spectrum was obtained every 5 seconds for a total of 200 seconds. A total of 41 spectra were obtained for each experiment.

Polymerization conversion versus time was calculated based on the specific IR peak change representing each functional group. To calculate the conversion for each relevant functional group, the peak height or peak area (as applicable from the chart below) was calculated as appropriate according to the table below:

| Functional group | Method | Height or area (cm−1) | Baseline (cm−1) |
|---|---|---|---|
| Cycloaliphatic epoxy | Height | 787.791 | 856.253-778.149 |
| Oxetane | Area | 998.962-943.999 | 998.962-943.999 |
| Acrylate | Area | 1419.374-1396.232 | 1419.374-1396.232 |

From the raw data, the east squared t of the first three data points (ending at 12 seconds±1 second) for the polymerization conversion of the cycloaliphatic epoxy was calculated using the LINEST function in Microsoft Excel version 14.0.7116.5000 (32 bit), and recorded below in Tables 6-9 (appearing as "LSF from 0 to 12 sec"). Further, the polymerization conversion of the cycloaliphatic epoxy, oxetane, and/or acrylate at 200 seconds was noted and reported as well in Tables 6-9 (appearing as "% Cycloaliphatic epoxide conversion@ 200 sec", "% Acrylate conversion@200 sec", or "% Oxetane conversion@ 200 sec" as appropriate).

With the raw data obtained, in order to apply the cure speed model, the first one to two data points were removed since the experimental cure speed procedure has an unknown short time lag between turning on of the FTIR detecting equipment and the light source used to cure the sample. To account for any uncertainty associated with the amount of statistical noise generated by these preliminary data points, three sets of curve fits were generated for each data set. In each case, the model equation against which the data set was to be fit is Conv=a(1−e(−b*(time−c))). For this, Microsoft Excel version 14.0.7116.5000 (32 bit) with the data analysis add on was used to fit the raw data.

In the first case, the entire data set (including the first two data points) was fit. In the second case, the entire data set minus the first data point was fit. In the third case, the entire data set minus the first and second data points was fit. In each case a curve fit coefficient $r^2$ was created. The data set that has the first data point above 1% conversion and its curve fit combination yielding an $r^2$ above 0.90 was selected for use and the resulting curve fit equation results were used for further calculation of cure speed at 95% of plateau conversion. In the event that the curve fit coefficient $r^2$ was below 0.90, the data was rerun again.

As discussed above, the data was fit to the equation form Conv=a(1−e(−b*(time−c))), where "Conv" is the conversion % as measured by FTIR peak ratios, and time being the time of light exposure duration, "a" being the plateau conversion, "b" being the resulting derived cure speed coefficient which was used to calculate the cure speed, and "c" being the resulting derived cure induction time. Once the data was fit, the software generated the experimentally derived equation with the numerical parameters for "a," "b," and "c" being determined from the experimental data and the fit. For cationically curable materials (i.e. epoxies and oxetanes), "c" has no meaning since there is no cure induction time. However for the sake of model completeness, the values are nonetheless reported herein. The variable "a" was used as the plateau conversion under the cure conditions used and represents the total asymptotic extent to which the component was converted. The variable "b" was used to calculate the time to 95% plateau conversion ($T_{95}$) of "a" through the equation $T_{95}=\ln(0.05/b)$. Variables "a", "b", and "c", as well as the $T_{59}$ for each sample is entered into Tables 6, 7, 8, and 9 as appropriate (and if available).

TABLE 6

The effect of various photoinitiating packages on cure performance under UV/vis conditions (400 nm LED)

| | Photoinitiating Package | | | | | | | Base | | Parameters in RT-FTIR cure speed model: Conversion = a(1 − e^(−b*(time − c))) | | | $T_{95}$ (s) (from RT-FTIR cure speed model) | LSF from 0 to 12 sec (s) | % Cycloaliphatic epoxide conversion @ 200 s | % Acrylate Conversion @ 200 s |
|---|---|---|---|---|---|---|---|---|---|---|---|---|---|---|---|---|
| Example | Irgacure 250 | Bluesil PI 2074 | TEGDVE | BAPO | Ivocerin | CPTX | | Resin 1 | Total | a | b | c | | | | |
| 1 | 2 | 0 | 0 | 0 | 0 | 0 | | 97 | 100 | 6.42 | 0.044 | 0 | 76 | 0.41 | 7.2 | 100 |
| 2 | 2 | 0 | 0 | 1 | 0 | 0 | | 97 | 100 | 40.1 | 0.013 | 1.02 | 236 | 0.42 | 37.3 | 100 |
| 3 | 2 | 0 | 0 | 0 | 0 | 1 | | 97 | 100 | 64.95 | 0.03 | 5.87 | 102 | 0.94 | 66.6 | 39 |
| 4 | 2 | 0 | 3 | 0 | 0 | 0 | | 94 | 100 | 35.42 | 0.018 | 3.37 | 163 | 0.39 | 35.2 | 100 |
| 5 | 2 | 0 | 3 | 1 | 0 | 0 | | 94 | 100 | 74.29 | 0.043 | 4.67 | 76 | 1.64 | 67.3 | 100 |
| 6 | 2 | 0 | 3 | 0 | 0 | 1 | | 94 | 100 | 49.77 | 0.059 | 3.74 | 51 | 2.11 | 51.4 | 83 |
| 7 | 2 | 0 | 0 | 0 | 1 | 0 | | 96 | 100 | 32.99 | 0.019 | 3.28 | 164 | 0.38 | 33.8 | 100 |
| 8 | 2 | 0 | 0 | 1 | 1 | 0 | | 93 | 100 | 45.7 | 0.047 | 7.15 | 61 | 0.62 | 47 | 100 |
| 9 | 2 | 0 | 0 | 0 | 1 | 1 | | 96 | 100 | 51.34 | 0.042 | 5.61 | 69 | 0.91 | 52.6 | 100 |
| 10 | 2 | 0 | 3 | 0 | 1 | 0 | | 93 | 100 | 66.83 | 0.072 | 5.13 | 56 | 2.62 | 69.1 | 100 |
| 11 | 2 | 0 | 3 | 1 | 0 | 1 | | 96.75 | 100 | 37.81 | 0.014 | 3.73 | 209 | 0.32 | 36.3 | 100 |
| 12 | 2 | 0 | 3 | 0 | 1 | 0.25 | | 93.75 | 100 | 67.22 | 0.028 | 4.77 | 110 | 0.98 | 69.3 | 100 |
| 13 | 2 | 0 | 3 | 0 | 0 | 0.25 | | 96.75 | 100 | 60.29 | 0.028 | 5.31 | 101 | 0.82 | 61.2 | 100 |
| 14 | 2 | 0 | 3 | 0 | 1 | 0.25 | | 93.75 | 100 | 68.56 | 0.05 | 5.22 | 66 | 1.69 | 70.8 | 100 |
| 15 | 2 | 0 | 0 | 0 | 0 | 0.5 | | 96.5 | 100 | 52.55 | 0.035 | 5.8 | 89 | 0.87 | 54 | 100 |
| 16 | 2 | 0 | 3 | 1 | 0 | 0.5 | | 93.5 | 100 | 69.91 | 0.035 | 4.55 | 91 | 1.32 | 71.7 | 100 |
| 17 | 2 | 0 | 0 | 0 | 1 | 0.5 | | 96.5 | 100 | 41.22 | 0.023 | 4.56 | 126 | 0.52 | 41.1 | 100 |
| 18 | 2 | 0 | 3 | 0 | 1 | 0.5 | | 93.5 | 100 | 71.41 | 0.061 | 5.16 | 56 | 2.18 | 74.4 | 100 |
| 19 | 0 | 2 | 0 | 0 | 0 | 0 | | 97 | 100 | 11.05 | 0.012 | 0 | 254 | 0.3 | 11.4 | 100 |
| 20 | 0 | 2 | 0 | 1 | 0 | 0 | | 97 | 100 | 59.28 | 0.003 | 3.27 | 1094 | 0.28 | 23.8 | 100 |
| 21 | 0 | 2 | 0 | 0 | 0 | 1 | | 97 | 100 | 63.38 | 0.041 | 3.44 | 72 | 1.78 | 66.3 | 51 |
| 22 | 0 | 2 | 3 | 0 | 0 | 0 | | 94 | 100 | 34.92 | 0.011 | 0 | 279 | 0.39 | 31.7 | 100 |
| 23 | 0 | 2 | 3 | 1 | 0 | 0 | | 94 | 100 | 61.86 | 0.035 | 5.33 | 85 | 1.04 | 64.7 | 100 |
| 24 | 0 | 2 | 3 | 0 | 0 | 1 | | 94 | 100 | 58.95 | 0.039 | 3.85 | 77 | 1.49 | 61.6 | 93 |
| 25 | 0 | 2 | 0 | 0 | 1 | 0 | | 96 | 100 | 40.82 | 0.033 | 4.01 | 91 | 0.85 | 42.5 | 100 |
| 26 | 0 | 2 | 0 | 1 | 1 | 0 | | 93 | 100 | 53.73 | 0.035 | 1.92 | 85 | 1.5 | 56 | 100 |
| 27 | 0 | 2 | 0 | 0 | 1 | 1 | | 96 | 100 | 49.9 | 0.026 | 2.2 | 114 | 0.95 | 51 | 100 |
| 28 | 0 | 2 | 3 | 0 | 1 | 0 | | 93 | 100 | 62.14 | 0.05 | 3.17 | 61 | 2.18 | 64.7 | 100 |
| 29 | 0 | 2 | 3 | 1 | 0 | 0.25 | | 96.75 | 100 | 45.82 | 0.018 | 0.38 | 169 | 0.75 | 45.4 | 100 |
| 30 | 0 | 2 | 3 | 0 | 0 | 0.25 | | 93.75 | 100 | 45.72 | 0.02 | 0 | 151 | 0.83 | 46.7 | 100 |
| 31 | 0 | 2 | 3 | 0 | 1 | 0.25 | | 96.75 | 100 | 63.85 | 0.025 | 3.52 | 118 | 1 | 63.1 | 100 |
| 32 | 0 | 2 | 3 | 1 | 0 | 0.25 | | 93.75 | 100 | 62.84 | 0.051 | 3.33 | 59 | 2.21 | 65.7 | 100 |
| 33 | 0 | 2 | 0 | 0 | 0 | 0.5 | | 96.5 | 100 | 43.9 | 0.027 | 3.13 | 113 | 0.78 | 45.3 | 100 |
| 34 | 0 | 2 | 0 | 1 | 0 | 0.5 | | 93.5 | 100 | 43.03 | 0.025 | 1.36 | 121 | 0.83 | 43.7 | 100 |
| 35 | 0 | 2 | 0 | 0 | 1 | 0.5 | | 96.5 | 100 | 55.68 | 0.031 | 2.58 | 98 | 1.23 | 57.5 | 100 |
| 36 | 0 | 2 | 3 | 0 | 1 | 0.5 | | 93.5 | 100 | 60.37 | 0.048 | 3.24 | 62 | 2.05 | 63.3 | 100 |
| 37 | 0 | 2 | 0.5 | 1 | 0 | 1 | | 95.5 | 100 | 49.04 | 0.037 | 1.52 | 81 | 1.49 | 50.8 | 100 |
| 38 | 0 | 2 | 1.5 | 1 | 0 | 1 | | 94.5 | 100 | 51.55 | 0.038 | 3.12 | 79 | 1.39 | 54.2 | 100 |
| 39 | 0 | 2 | 0.5 | 0 | 1 | 1 | | 95.5 | 100 | 52.36 | 0.032 | 3.81 | 93 | 0.98 | 54.9 | 100 |
| 40 | 0 | 2 | 1.5 | 0 | 1 | 1 | | 94.5 | 100 | 55.6 | 0.035 | 1.8 | 87 | 1.52 | 57.9 | 100 |

TABLE 7

Effect of various photoinitiator solvents on cure performance under UV conditions (355 nm)**

| | Photoinitiating Package | | | | | Solvent | | Base | Somos® |
|---|---|---|---|---|---|---|---|---|---|
| Example | CPI-6976 | Irgacure 184 | Bluesil PI 2074 | Chivacure BMS | Chivacure 1173 | TEGDVE | PC | Resin 1 | NeXt |
| 41 | 0 | 0 | 0 | 0 | 0 | 0 | 0 | 0 | 100 |
| 42 | 0.1 | 0.1 | 0 | 0 | 0 | 3 | 0 | 0 | 96.8 |
| 43 | 0.1 | 0.1 | 0 | 0 | 0 | 0 | 3 | 0 | 96.8 |
| 44 | 0 | 0 | 0.74 | 0.24 | 3.62 | 0 | 0 | 95.4 | 0 |
| 45 | 0 | 0 | 0.74 | 0.24 | 3.62 | 3 | 0 | 92.4 | 0 |
| 46 | 0 | 0 | 0.74 | 0.24 | 3.62 | 0 | 3 | 92.4 | 0 |

| | Parameters in Rt-FTIR cure speed model (fitting either Oxetane conversion or CA epoxy conversion, as noted) Conversion = a(1 − $e^{(-b*(time - c))}$) | | | $T_{95}$ (s) (from RT-FTIR cure | LSF from | % Cycloaliphatic epoxide conversion |
|---|---|---|---|---|---|---|
| Example | a | b | c | speed model) | 0 to 12 sec | @ 200 sec * |
| 41 | 53.05 | .013 | 0 | 227 | 1 | 50.6 * |
| 42 | 48.28 | .014 | 0 | 208 | 1.33 | 48.7 * |
| 43 | 55.62 | .015 | 0 | 206 | 1.08 | 54.2 * |
| 44 | 67.87 | .022 | 7.15 | 135 | 0.55 | 68.8 |
| 45 | 70.31 | .026 | 10.35 | 115 | 0.24 | 71.7 |
| 46 | 82.13 | .019 | 6.87 | 157 | 0.49 | 81.5 |

* Values for Examples 41-43 represent % oxetane conversion @ 200 sec due to lack of reliable data for % cycloaliphatic epoxide conversion.
**Each of examples 41-46 exhibited 100% acrylate conversion at 200 seconds.
All quantities are listed in parts by weight.

TABLE 8

The effect of various photoinitiator solvents on cure performance under UV/vis conditions (400 nm LED)

| | Photoinitiating Package | | | | | | Base | Parameters in RT-FTIR cure speed model: Conversion = a(1 − $e^{(-b*(time - c))}$) |
|---|---|---|---|---|---|---|---|---|
| | Bluesil | Solvent | | | | | | |
| Example | PI 2074 | TEGDVE | PC | BAPO | Ivocerin | CPTX | Resin 1 | a |
| 47 | 2 | 0 | 0 | 1 | 0 | 0.25 | 96.75 | 25.17 |
| 48 | 2 | 0 | 3 | 1 | 0 | 0.25 | 93.75 | 38.95 |
| 49 | 2 | 0 | 0 | 0 | 1 | 0.25 | 96.75 | 44.08 |
| 50 | 2 | 0 | 3 | 0 | 1 | 0.25 | 93.75 | 51.92 |
| 51 (repeat of 30) | 2 | 3 | 0 | 1 | 0 | 0.25 | 93.75 | 45.72 |
| 52 (repeat of 32) | 2 | 3 | 0 | 0 | 1 | 0.25 | 93.75 | 62.84 |

| | Parameters in RT-FTIR cure speed model: Conversion = a(1 − $e^{(-b*(time - c))}$) | | $T_{95}$ (s) (from RT-FTIR cure | LSF from | % cycloaliphatic epoxide conversion | % acrylate conversion |
|---|---|---|---|---|---|---|
| Example | b | c | speed model) | 0 to 12 sec | @ 200 s | |
| 47 | 0.01 | 0 | 302 | 0.47 | 23.1 | 100 |
| 48 | 0.01 | 0 | 309 | 0.76 | 34.7 | 100 |
| 49 | 0.006 | 0 | 503 | 0.5 | 31.4 | 100 |
| 50 | 0.009 | 0 | 338 | 0.6 | 45.2 | 100 |
| 51 (repeat of 30) | 0.02 | 0 | 151 | 0.83 | 46.7 | 100 |
| 52 (repeat of 32) | 0.051 | 3.33 | 59 | 2.21 | 65.7 | 100 |

All quantities are listed in parts by weight.

TABLE 9

| | Cure performance under UV/vis conditions (400 nm LED) | | | | | | | |
|---|---|---|---|---|---|---|---|---|
| | Photoinitiating Package | | | | | | | Parameters in RT-FTIR cure speed model: Conversion = a(1 − e^(−b*(time − c))) |
| Example | PI 2074 | TEGDVE | BAPO | Ivocerin | UVS-1101 | Chivacure 1176 | Base Resin 1 | Total | a |
| 53 | 2 | 0 | 1 | 0 | 1 | 0 | 96 | 100 | 38.8 |
| 54 | 2 | 0 | 0 | 1 | 1 | 0 | 96 | 100 | 57.29 |
| 55 | 2 | 3 | 1 | 0 | 1 | 0 | 93 | 100 | 49.55 |
| 56 | 2 | 3 | 0 | 1 | 1 | 0 | 93 | 100 | 69.81 |
| 57 | 0 | 3 | 1 | 0 | 1 | 4 | 91 | 100 | 54.33 |
| 58 | 0 | 3 | 0 | 1 | 1 | 4 | 91 | 100 | 43.35 |
| 59 | 0 | 0 | 1 | 0 | 1 | 4 | 94 | 100 | 34.6 |
| 60 | 0 | 0 | 0 | 1 | 1 | 4 | 94 | 100 | 42.3 |

| | Parameters in RT-FTIR cure speed model: Conversion = a(1 − e^(−b*(time − c))) | | $T_{95}$ (s) (from RT-FTIR cure speed model) | LSF from 0 to 12 s | % cycloaliphatic epoxide conversion @ 200 s | % acrylate conversion @ 200 s |
|---|---|---|---|---|---|---|
| Example | b | c | | | | |
| 53 | 0.025 | 7.52 | 122 | 0.33 | 39.3 | 32 |
| 54 | 0.015 | 6.25 | 204 | 0.42 | 54.8 | 65 |
| 55 | 0.019 | 3.39 | 160 | 0.64 | 49.8 | 36 |
| 56 | 0.031 | 5.43 | 98 | 1.03 | 72.3 | 85 |
| 57 | 0.019 | 1.02 | 155 | 0.83 | 55.2 | 53 |
| 58 | 0.013 | 2.87 | 226 | 0.42 | 41.5 | 87 |
| 59 | 0.02 | 5.96 | 153 | 0.26 | 35.4 | 68 |
| 60 | 0.013 | 5.04 | 229 | 0.25 | 40.1 | 100 |

Discussion of Results

As can be seen, when photoinitiating packages according to the present invention are employed, the resulting hybrid-polymerizable compositions when subjected to UV/vis conditions exhibits suitable cure to be used in various additive fabrication processes employing UV/vis optics, as measured by curve-fit $T_{95}$ values, the rate of epoxide conversion, amount of epoxide conversion, and/or amount of acrylate conversion.

Additional Exemplary Embodiments

A first aspect of a first additional exemplary embodiment of the invention is a radiation curable composition for additive fabrication comprising:
  (a) a photoinitiating package comprising
    an onium salt cationic photoinitiator;
    a Norrish Type I photoinitiator; and
    optionally, a photosensitizer for photosensitizing the onium salt cationic photoinitiator;
  (b) a cationically curable constituent comprising
    optionally, a cycloaliphatic epoxide;
    optionally, a glycidyl ether epoxide, and
    optionally, an oxetane;
  (c) a free-radically polymerizable component;
  (d) a component possessing an electron-donating substituent attached to a vinyl group; and
  (e) optionally, one or more additives.

An additional aspect of the first exemplary embodiment is a radiation curable composition for additive fabrication according to any of the previous aspects of the first exemplary embodiment of the invention, wherein the cationic photoinitiator is an iodonium salt cationic photoinitiator.

An additional aspect of the first exemplary embodiment is a radiation curable composition for additive fabrication according to any of the previous aspects of the first exemplary embodiment of the invention, wherein at least one of the cycloaliphatic epoxide, glycidyl ether epoxide, and oxetane are not optional.

An additional aspect of the first exemplary embodiment is a radiation curable composition for additive fabrication according to any of the previous aspects of the first exemplary embodiment of the invention, wherein at least two of the cycloaliphatic epoxide, glycidyl ether epoxide, and oxetane are not optional.

An additional aspect of the first exemplary embodiment is a radiation curable composition for additive fabrication according to any of the previous aspects of the first exemplary embodiment of the invention, wherein the cycloaliphatic epoxide, glycidyl ether epoxide, and oxetane are each not optional.

An additional aspect of the first exemplary embodiment is a radiation curable composition for additive fabrication according to any of the previous aspects of the first exemplary embodiment of the invention, wherein the component possessing an electron-donating substituent attached to a vinyl group is present in an amount from 0.5 wt. % to 20 wt. %, or from 1.0 wt. % to 15 wt. %, or from 1.5 wt. % to 10 wt. %, or from 2.5 wt. % to 8 wt. %, or from 3 wt. % to 5 wt. %.

An additional aspect of the first exemplary embodiment is a radiation curable composition for additive fabrication according to any of the previous aspects of the first exemplary embodiment of the invention, wherein the Norrish Type I photoinitiator is configured to enter a triplet state upon excitation by exposure to actinic radiation, wherein said excited triplet state possesses an ionization potential of less than about 4.15 eV, more preferably 3.98 eV, more preferably less than 3.90 eV, more preferably less than 3.80 eV, more preferably less than 3.70 eV, more preferably less than 3.55 eV, wherein the ionization potential is calculated in accordance with molecular modeling under B3LYP/6-31G(d) in combination with Koopman's Theorem (IP=−ε$_{HOMO}$).

An additional aspect of the first exemplary embodiment is a radiation curable composition for additive fabrication according to any of the previous aspects of the first exemplary embodiment of the invention, wherein the Norrish Type I photoinitiator is configured to enter a triplet state upon excitation by exposure to actinic radiation, wherein said excited triplet state possesses an ionization potential of at least 2.5 eV, more preferably at least 3.0 eV, wherein the ionization potential is calculated in accordance with molecular modeling under B3LYP/6-31G(d) in combination with Koopman's Theorem (IP=−ε$_{HOMO}$).

An additional aspect of the first exemplary embodiment is a radiation curable composition for additive fabrication according to any of the previous aspects of the first exemplary embodiment of the invention, wherein the Norrish Type I photoinitiator is also a photosensitizer for photosensitizing the iodonium salt cationic photoinitiator.

An additional aspect of the first exemplary embodiment is a radiation curable composition for additive fabrication according to any of the previous aspects of the first exemplary embodiment of the invention, wherein the Norrish Type I photoinitiator is alkyl-, aryl-, or acyl-substituted.

An additional aspect of the first exemplary embodiment is a radiation curable composition for additive fabrication according to any of the previous aspects of the first exemplary embodiment of the invention, wherein the Norrish Type I photoinitiator that is alkyl-, aryl-, or acyl-substituted comprises a compound possessing or centered around a Group 14 atom.

An additional aspect of the first exemplary embodiment is a radiation curable composition for additive fabrication according to any of the previous aspects of the first exemplary embodiment of the invention, wherein the Norrish Type I photoinitiator that is alkyl-, aryl-, or acyl-substituted comprises a compound possessing an atom selected from the group consisting of silicon, germanium, tin, and lead.

An additional aspect of the first exemplary embodiment is a radiation curable composition for additive fabrication according to any of the previous aspects of the first exemplary embodiment of the invention, wherein the Norrish Type I photoinitiator is an acylgermanium compound.

An additional aspect of the first exemplary embodiment is a radiation curable composition for additive fabrication according to any of the previous aspects of the first exemplary embodiment of the invention, wherein the acylgermanium compound possesses a structure in accordance with the following formula (I):

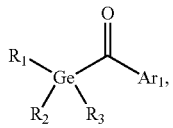

in which Ar$_1$ is an aromatic group, either unsubstituted or further substituted in any position by one or more alkyl radicals, ethers, sulfides, silyl groups, halogens, carboxyl groups, vinyl groups, additional aromatic or heterocyclic groups, alkyl radicals, or aromatic or heterocyclic groups interrupted by one or more ether, sulfide, silyl, carboxyl, or vinyl groups, and in which R$_1$, R$_2$, and R$_3$ independently may be an acyl, aryl, alkyl, or carbonyl group, either unsubstituted or further substituted one or more alkyl radicals, ethers, sulfides, silyl groups, halogens, carboxyl groups, vinyl groups, additional aromatic or heterocyclic groups, alkyl radicals, or aromatic or heterocyclic groups interrupted by one or more ether, sulfide, silyl, carboxyl, or vinyl groups.

An additional aspect of the first exemplary embodiment is the radiation curable composition for additive fabrication according to the previous described aspect of the first exemplary embodiment of the invention, wherein each of R$_1$-R$_3$ is an aryl-substituted or aromatic acyl group; or when exactly two of R$_1$-R$_3$ are an aryl-substituted or aromatic acyl group, the remaining substituted groups are a C$_1$-C$_{10}$, more preferably C$_1$-C$_6$, more preferably C$_1$-C$_3$ alkyl; or when exactly one of R$_1$-R$_3$ is an aryl-substituted or aromatic acyl group, the remaining two substituted groups are a C$_1$-C$_{10}$, more preferably C$_1$-C$_6$, more preferably C$_1$-C$_3$ alkyl; or each of R$_1$-R$_3$ is a C$_1$-C$_{10}$, more preferably C$_1$-C$_6$, more preferably C$_1$-C$_3$ alkyl.

An additional aspect of the first exemplary embodiment is a radiation curable composition for additive fabrication according to any of the previous aspects of the first exemplary embodiment of the invention, wherein the acylgermanium compound is a compound selected from a group consisting of:

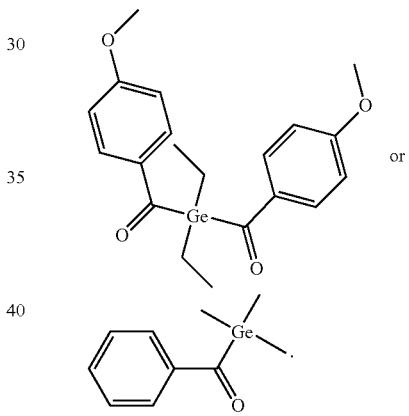

An additional aspect of the first exemplary embodiment is a radiation curable composition for additive fabrication according to any of the previous aspects of the first exemplary embodiment of the invention, wherein the Norrish Type I photoinitiator is configured to form a radical upon exposure to actinic radiation.

An additional aspect of the first exemplary embodiment is a radiation curable composition for additive fabrication according to any of the previous aspects of the first exemplary embodiment of the invention, wherein the radical formed from the Norrish Type I photoinitiator possesses a calculated ionization potential of less than or equal to 5.50 eV, more preferably less than 5.00 eV, more preferably less than 4.80 eV, as calculated by molecular modeling under B3LYP/6-31G(d) in combination with Koopman's Theorem (IP=−ε$_{HOMO}$).

An additional aspect of the first exemplary embodiment is a radiation curable composition for additive fabrication according to any of the previous aspects of the first exemplary embodiment of the invention, wherein the radical formed from the Norrish Type I photoinitiator is possesses a calculated ionization potential of at least 4.05 eV, as calculated by molecular modeling under B3LYP/6-31G(d) in combination with Koopman's Theorem (IP=−$\varepsilon_{HOMO}$).

An additional aspect of the first exemplary embodiment is a radiation curable composition for additive fabrication according to any of the previous aspects of the first exemplary embodiment of the invention, wherein the molar ratio of the iodonium salt cationic photoinitiator to the component possessing an electron-donating substituent attached to a vinyl group is from 2:1 to 1:50, more preferably from 1:1 to 1:30, or from 1:2 to 1:20, or from 1:5 to 1:10.

An additional aspect of the first exemplary embodiment is a radiation curable composition for additive fabrication according to any of the previous aspects of the first exemplary embodiment of the invention, wherein the molar ratio of the Norrish Type I photoinitiator to the component possessing an electron-donating substituent attached to a vinyl group is from 2:1 to 1:50, more preferably from 1:1 to 1:30, or from 1:2 to 1:20, or from 1:5 to 1:10.

An additional aspect of the first exemplary embodiment is a radiation curable composition for additive fabrication according to any of the previous aspects of the first exemplary embodiment of the invention, wherein the molar ratio of the iodonium salt cationic photoinitiator to the Norrish Type I photoinitiator is from 1:4 to 4:1 more preferably from 1:2 to 2:1, or from 3:4 to 4:3.

An additional aspect of the first exemplary embodiment is a radiation curable composition for additive fabrication according to any of the previous aspects of the first exemplary embodiment of the invention, wherein the photoinitiator package contains the following, relative to the entire weight of the photoinitiator package:
from 25 wt. % to 33 wt. % of the iodonium salt cationic photoinitiator;
from 10 wt. % to 25 wt. % of the Norrish Type I photoinitiator;
from 33 wt. % to 66 wt. % of the electron-donating substituent attached to a vinyl group.

An additional aspect of the first exemplary embodiment is a radiation curable composition for additive fabrication according to any of the previous aspects of the first exemplary embodiment of the invention, wherein the component possessing an electron-donating substituent attached to a vinyl group is configured to produce a vinyl-based radical possessing an ionization potential of less than or equal to 6.58 eV, more preferably less than 5.42 eV, less than 4.89 eV, more preferably less than 4.30 eV, most preferably less than 4.20 eV, wherein the ionization potential is calculated in accordance with molecular modeling under B3LYP/6-31G (d) in combination with Koopman's Theorem (IP=−$\varepsilon_{HOMO}$).

An additional aspect of the first exemplary embodiment is a radiation curable composition for additive fabrication according to any of the previous aspects of the first exemplary embodiment of the invention, wherein the component possessing an electron-donating substituent attached to a vinyl group is configured to produce a vinyl-based radical possessing an ionization potential of at least 3.3 eV, more preferably at least 3.5 eV, more preferably at least 3.8 eV, wherein the ionization potential is calculated in accordance with molecular modeling under B3LYP/6-31G(d) in combination with Koopman's Theorem (IP=−$\varepsilon_{HOMO}$).

An additional aspect of the first exemplary embodiment is a radiation curable composition for additive fabrication according to any of the previous aspects of the first exemplary embodiment of the invention, wherein the Norrish Type I photoinitiator is configured to create a radical that possesses a rate of addition to the component possessing an electron-donating substituent attached to a vinyl group of greater than about $10^4$ $M^{-1}$ $s^{-1}$, more preferably greater than about $10^5$ $M^{-1}$ $s^{-1}$, most preferably greater than about $3 \times 10^5$ $M^{-1}$ $s^{-1}$.

An additional aspect of the first exemplary embodiment is a radiation curable composition for additive fabrication according to any of the previous aspects of the first exemplary embodiment of the invention, wherein the component possessing an electron-donating substituent attached to a vinyl group is liquid at 25 degrees Celsius.

An additional aspect of the first exemplary embodiment is a radiation curable composition for additive fabrication according to any of the previous aspects of the first exemplary embodiment of the invention, wherein the Norrish Type I photoinitiator is pre-dissolved in a solvent consisting of the component possessing an electron-donating substituent attached to a vinyl group.

An additional aspect of the first exemplary embodiment is a radiation curable composition for additive fabrication according to any of the previous aspects of the first exemplary embodiment of the invention, wherein the component possessing an electron-donating substituent attached to a vinyl group is selected from the group consisting of vinyl ethers, vinyl esters, vinyl thioethers, n-vinyl carbazoles, n-vinyl pyrollidones, n-vinyl caprolactams, allyl ethers, and vinyl carbonates.

An additional aspect of the first exemplary embodiment is a radiation curable composition for additive fabrication according to any of the previous aspects of the first exemplary embodiment of the invention, wherein the component possessing an electron-donating substituent attached to a vinyl group is multifunctional.

An additional aspect of the first exemplary embodiment is a radiation curable composition for additive fabrication according to any of the previous aspects of the first exemplary embodiment of the invention, wherein the component possessing an electron-donating substituent attached to a vinyl group is a vinyl ether.

An additional aspect of the first exemplary embodiment is a radiation curable composition for additive fabrication according to any of the previous aspects of the first exemplary embodiment of the invention, wherein the photosensitizer is not optional and also possesses an excited triplet state.

An additional aspect of the first exemplary embodiment is a radiation curable composition for additive fabrication according to any of the previous aspects of the first exemplary embodiment of the invention, wherein the excited triplet state of the photosensitizer possesses an ionization potential of less than about 4.15 eV, more preferably less than about 3.98 eV, more preferably less than 3.90 eV, more preferably less than 3.80 eV, more preferably less than 3.70 eV, more preferably less than 3.55 eV, wherein the ionization potential is calculated in accordance with molecular modeling under B3LYP/6-31G(d) in combination with Koopman's Theorem (IP=−$\varepsilon_{HOMO}$).

An additional aspect of the first exemplary embodiment is a radiation curable composition for additive fabrication according to any of the previous aspects of the first exemplary embodiment of the invention, wherein the excited triplet state of the photosensitizer possesses an ionization potential of greater than about 2.5 eV, more preferably at least about 3.0 eV, wherein the ionization potential is calculated in accordance with molecular modeling under B3LYP/6-31G(d) in combination with Koopman's Theorem (IP=−$\varepsilon_{HOMO}$).

An additional aspect of the first exemplary embodiment is a radiation curable composition for additive fabrication according to any of the previous aspects of the first exemplary embodiment of the invention, wherein the ionization potential of the excited triplet state of the photosensitizer is greater than the ionization potential of the excited triplet state of the Norrish Type I photoinitiator.

An additional aspect of the first exemplary embodiment is a radiation curable composition for additive fabrication according to any of the previous aspects of the first exemplary embodiment of the invention, wherein the Norrish Type I photoinitiator is present in the composition in a greater amount by weight, relative to the entire composition, than the photosensitizer.

An additional aspect of the first exemplary embodiment is a radiation curable composition for additive fabrication according to any of the previous aspects of the first exemplary embodiment of the invention, wherein the oxetane is monofunctional and additionally possesses a hydroxyl group.

An additional aspect of the first exemplary embodiment is a radiation curable composition for additive fabrication according to any of the previous aspects of the first exemplary embodiment of the invention, wherein the cycloaliphatic epoxide constituent possesses a structure according to the following formula:

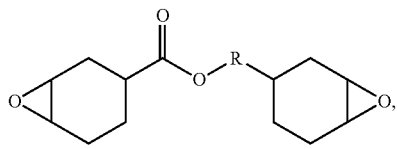

wherein R is a carbon atom or an ester-containing $C_1$-$C_{10}$ aliphatic chain.

An additional aspect of the first exemplary embodiment is a radiation curable composition for additive fabrication according to any of the previous aspects of the first exemplary embodiment of the invention, wherein the glycidyl ether epoxy is selected from the group consisting of bisphenol A-based glycidyl ether, a bisphenol S-based glycidyl ether, and a bisphenol F-based glycidyl ether.

An additional aspect of the first exemplary embodiment is a radiation curable composition for additive fabrication according to any of the previous aspects of the first exemplary embodiment of the invention, wherein the iodonium salt cationic photoinitiator is a diphenyl iodonium salt.

An additional aspect of the first exemplary embodiment is a radiation curable composition for additive fabrication according to any of the previous aspects of the first exemplary embodiment of the invention, wherein the diphenyl iodonium salt is selected from the group consisting of (4-methylphenyl)[4-(2-methylpropyl) phenyl]-, hexafluorophosphate, [4-(1-methylethyl)phenyl](4-methylphenyl)-, tetrakis(pentafluorophenyl)borate(1-), (Bis(4-dodecylphenyl)iodonium hexaflurorantimonate), and (Bis(4-tert-butylphenyl)iodonium hexafluorophosphate).

An additional aspect of the first exemplary embodiment is a radiation curable composition for additive fabrication according to any of the previous aspects of the first exemplary embodiment of the invention, wherein if the radiation curable composition is exposed to UV/vis optics emitting radiation with a peak spectral output at 400 nm and an irradiance at a surface of the radiation curable composition of 2 mW/cm² for 10 seconds achieves the following:

a cycloaliphatic epoxide conversion at 200 seconds of at least about 60%, more preferably at least about 65%, more preferably at least about 70%.

An additional aspect of the first exemplary embodiment is a radiation curable composition for additive fabrication according to any of the previous aspects of the first exemplary embodiment of the invention, wherein when the radiation curable composition is exposed to UV/vis optics emitting radiation with a peak spectral output at 400 nm and an irradiance at a surface of the radiation curable composition of 2 mW/cm² for 10 seconds achieves the following:

a cycloaliphatic epoxide $T_{95}$ value of less than about 100 seconds, more preferably less than
about 90 seconds, more preferably less than about 80 seconds, more preferably less than
about 70 seconds, more preferably less than about 60 seconds.

An additional aspect of the first exemplary embodiment is a radiation curable composition for additive fabrication according to any of the previous aspects of the first exemplary embodiment of the invention, wherein when the radiation curable composition is exposed to UV/vis optics emitting radiation with a peak spectral output at 400 nm and an irradiance at a surface of the radiation curable composition of 2 mW/cm² for 10 seconds achieves the following:

a least squares fit of the initial 12 seconds of the cycloaliphatic epoxide conversion rate of
at least about 1.25 $s^{-1}$, more preferably at least about 1.65 $s^{-1}$, more preferably at least about 2.00 $s^{-1}$.

An additional aspect of the first exemplary embodiment is a radiation curable composition for additive fabrication according to any of the previous aspects of the first exemplary embodiment of the invention, wherein when the radiation curable composition is exposed to UV/vis optics emitting radiation with a peak spectral output at 400 nm and an irradiance at a surface of the radiation curable composition of 2 mW/cm² for 10 seconds achieves the following:

an acrylate conversion at 200 seconds of at least about 95%, more preferably about 100%.

An additional aspect of the first exemplary embodiment is a radiation curable composition for additive fabrication according to any of the previous aspects of the first exemplary embodiment of the invention, wherein the photoinitiating package consists essentially of
a single iodonium salt cationic photoinitiator;
a single Norrish Type I photoinitiator having an excited triplet state;
a single photosensitizer; and
a single component possessing an electron-donating substituent attached to a vinyl group;

An additional aspect of the first exemplary embodiment is a radiation curable composition for additive fabrication according to any of the previous aspects of the first exemplary embodiment of the invention, wherein the photoinitiating package consists essentially of
a single iodonium salt cationic photoinitiator;
a single Norrish Type I photoinitiator having an excited triplet state
and a single component possessing an electron-donating substituent attached to a vinyl group;

An additional aspect of the first exemplary embodiment is a radiation curable composition for additive fabrication according to any of the previous aspects of the first exemplary embodiment of the invention, wherein the composition consists essentially of
the photoinitiating package of either of the two preceding claims;

a single cycloaliphatic epoxide component;
a single glycidyl ether epoxide component;
a single oxetane component; and
one or more free-radically polymerizable compounds.

A first aspect of a second additional exemplary embodiment of the invention is a liquid radiation curable composition for additive fabrication comprising:
a photoinitiating package comprising
an onium salt cationic photoinitiator;
a reductant comprising
an effective amount of a Norrish Type I photoinitiator dissolved in a vinyl ether compound that is a liquid at 25 C; and
optionally, a photosensitizer;
a cationically polymerizable constituent;
a free-radically polymerizable component; and
optionally, one or more additives.

An additional aspect of the second exemplary embodiment is a liquid radiation curable composition for additive fabrication according to the previous aspects of the second exemplary embodiment of the invention, wherein the onium salt cationic photoinitiator is dissolved in an inert diluent.

An additional aspect of the second exemplary embodiment is a liquid radiation curable composition for additive fabrication according to any of the previous aspects of the second exemplary embodiment of the invention, wherein the inert diluent comprises propylene carbonate.

An additional aspect of the second exemplary embodiment is a liquid radiation curable composition for additive fabrication according to any of the previous aspects of the second exemplary embodiment of the invention, wherein the Norrish Type I photoinitiator is capable of forming a radical possessing a calculated ionization potential of less than or equal to 5.50 eV, more preferably less than 5.00 eV, more preferably less than 4.80 eV, as calculated by molecular modeling under B3LYP/6-31G(d) in combination with Koopman's Theorem (IP=$-\varepsilon_{HOMO}$).

An additional aspect of the second exemplary embodiment is a liquid radiation curable composition for additive fabrication according to any of the previous aspects of the second exemplary embodiment of the invention, wherein the Norrish Type I photoinitiator is capable of forming a radical possessing a calculated ionization potential of at least 4.05 eV.

An additional aspect of the second exemplary embodiment is a liquid radiation curable composition for additive fabrication according to any of the previous aspects of the second exemplary embodiment of the invention, wherein the Norrish Type I photoinitiator is capable of entering a triplet state, wherein said triplet state possesses an ionization potential of less than about 4.15 eV, more preferably less than about 3.98 eV, more preferably less than 3.90 eV, more preferably less than 3.80 eV, more preferably less than 3.70 eV, more preferably less than 3.55 eV, wherein the ionization potential is calculated in accordance with molecular modeling under B3LYP/6-31G(d) in combination with Koopman's Theorem (IP=$-\varepsilon_{HOMO}$).

An additional aspect of the second exemplary embodiment is a liquid radiation curable composition for additive fabrication according to any of the previous aspects of the second exemplary embodiment of the invention, wherein the Norrish Type I photoinitiator is capable of entering a triplet state, wherein said triplet state possesses an ionization potential of at least 2.5 eV, more preferably at least 3.0 eV, wherein the ionization potential is calculated in accordance with molecular modeling under B3LYP/6-31G(d) in combination with Koopman's Theorem (IP=$-\varepsilon_{HOMO}$).

An additional aspect of the second exemplary embodiment is a liquid radiation curable composition for additive fabrication according to any of the previous aspects of the second exemplary embodiment of the invention, wherein the Norrish Type I photoinitiator is present in an amount by weight, relative to the entire composition, of from 0.1 wt. % to about 10 wt. %, more preferably from about 0.3 wt. % to about 5 wt. %, more preferably from about 0.5 wt. % to about 3 wt. %.

An additional aspect of the second exemplary embodiment is a liquid radiation curable composition for additive fabrication according to any of the previous aspects of the second exemplary embodiment of the invention, wherein the reductant is capable of producing a radical having a calculated ionization potential of less than or equal to 6.58 eV, more preferably less than 5.42 eV, less than 4.89 eV, more preferably less than 4.30 eV, most preferably less than 4.20 eV, wherein the ionization potential is calculated in accordance with molecular modeling under B3LYP/6-31G(d) in combination with Koopman's Theorem (IP=$-\varepsilon_{HOMO}$).

An additional aspect of the second exemplary embodiment is a liquid radiation curable composition for additive fabrication according to any of the previous aspects of the second exemplary embodiment of the invention, wherein the reductant is capable of producing a radical having a calculated ionization potential of less than or equal to 6.58 eV, more preferably less than 5.42 eV, less than 4.89 eV, more preferably less than 4.30 eV, most preferably less than 4.20 eV, wherein the ionization potential is calculated in accordance with molecular modeling under B3LYP/6-31G(d) in combination with Koopman's Theorem (IP=$-\varepsilon_{HOMO}$).

An additional aspect of the second exemplary embodiment is a liquid radiation curable composition for additive fabrication according to any of the previous aspects of the second exemplary embodiment of the invention, wherein the radical capable of being formed by the Norrish Type I photoinitiator possesses a rate of addition to the vinyl ether of greater than about $10^4$ $M^{-1}s^{-1}$, more preferably greater than about $10^5$ $M^{-1}$ $s^{-1}$, most preferably greater than about $3\times10^5$ $M^{-1}s^{-1}$.

An additional aspect of the second exemplary embodiment is a liquid radiation curable composition for additive fabrication according to any of the previous aspects of the second exemplary embodiment of the invention, wherein the Norrish Type I photoinitiator that is capable of forming a radical is alkyl-, aryl-, or acyl-substituted.

An additional aspect of the second exemplary embodiment is a liquid radiation curable composition for additive fabrication according to any of the previous aspects of the second exemplary embodiment of the invention, wherein the radical formed is a reductant for reducing the onium salt cationic photoinitiator.

An additional aspect of the second exemplary embodiment is a liquid radiation curable composition for additive fabrication according to any of the previous aspects of the second exemplary embodiment of the invention, wherein the Norrish Type I photoinitiator consists essentially of a compound which possesses an atom selected from the group consisting of the elements of Group 14, preferably from the group consisting of silicon, germanium, tin, and lead.

An additional aspect of the second exemplary embodiment is a liquid radiation curable composition for additive fabrication according to any of the previous aspects of the second exemplary embodiment of the invention, wherein the Norrish Type I photoinitiator consists essentially of an acylgermanium compound.

An additional aspect of the second exemplary embodiment is a liquid radiation curable composition for additive fabrication according to any of the previous aspects of the second exemplary embodiment of the invention, wherein the acylgermanium compound consists essentially of a compound represented by the following formula (I):

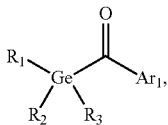
(I)

in which $Ar_1$ is an aromatic group, either unsubstituted or further substituted in any position by one or more alkyl radicals, ethers, sulfides, silyl groups, halogens, carboxyl groups, vinyl groups, additional aromatic or heterocyclic groups, alkyl radicals, or aromatic or heterocyclic groups interrupted by one or more ether, sulfide, silyl, carboxyl, or vinyl groups, and in which $R_1$, $R_2$, and $R_3$ independently may be an acyl, aryl, alkyl, or carbonyl group, either unsubstituted or further substituted one or more alkyl radicals, ethers, sulfides, silyl groups, halogens, carboxyl groups, vinyl groups, additional aromatic or heterocyclic groups, alkyl radicals, or aromatic or heterocyclic groups interrupted by one or more ether, sulfide, silyl, carboxyl, or vinyl groups.

An additional aspect of the second exemplary embodiment is the liquid radiation curable composition for additive fabrication according to the previous described aspect of the second exemplary embodiment of the invention, wherein each of $R_1$-$R_3$ is an aryl-substituted or aromatic acyl group; or when exactly two of $R_1$-$R_3$ are an aryl-substituted or aromatic acyl group, the remaining substituted groups are a $C_1$-$C_{10}$, more preferably $C_1$-$C_6$, more preferably $C_1$-$C_3$ alkyl; or when exactly one of $R_1$-$R_3$ is an aryl-substituted or aromatic acyl group, the remaining two substituted groups are a $C_1$-$C_{10}$, more preferably $C_1$-$C_6$, more preferably $C_1$-$C_3$ alkyl; or each of $R_1$-$R_3$ is a $C_1$-$C_{10}$, more preferably $C_1$-$C_6$, more preferably $C_1$-$C_3$ alkyl.

An additional aspect of the second exemplary embodiment is a liquid radiation curable composition for additive fabrication according to any of the previous aspects of the second exemplary embodiment of the invention, wherein the acylgermanium compound consists essentially of a compound possessing either of the following molecular structures:

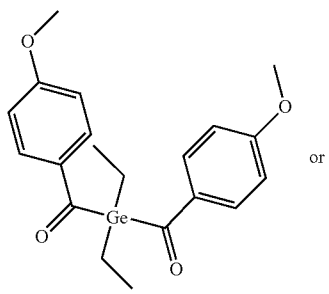
or
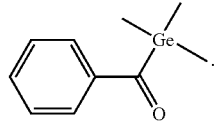

An additional aspect of the second exemplary embodiment is a liquid radiation curable composition for additive fabrication according to any of the previous aspects of the second exemplary embodiment of the invention, wherein the vinylether compound is present, relative to the weight of the entire composition, of from 0.5 wt. % to 20 wt. %, or from 1.0 wt. % to 15 wt. %, or from 1.5 wt. % to 10 wt. %, or from 2.5 wt. % to 8 wt. %, or from 3 wt. % to 5 wt. %.

An additional aspect of the second exemplary embodiment is a liquid radiation curable composition for additive fabrication according to any of the previous aspects of the second exemplary embodiment of the invention, wherein the vinyl ether compound is present, relative to the weight of the entire composition, of less than 15 wt. %, more preferably less than 10 wt. %, more preferably less than 5 wt. %.

An additional aspect of the first exemplary embodiment is a radiation curable composition for additive fabrication according to any of the previous aspects of the second exemplary embodiment of the invention, wherein the molar ratio of the onium salt cationic photoinitiator to the reductant is from 1:1 to 1:50, more preferably from 3:4 to 1:20, or from 1:2 to 1:15, or from 1:3 to 1:8.

An additional aspect of the first exemplary embodiment is a radiation curable composition for additive fabrication according to any of the previous aspects of the second exemplary embodiment of the invention, wherein the molar ratio in the reductant of the Norrish Type I photoinitiator to the vinyl ether compound is from 1:1 to 1:50, more preferably from 2:3 to 1:30, or from 1:2 to 1:20, or from 1:5 to 1:10.

An additional aspect of the second exemplary embodiment is a liquid radiation curable composition for additive fabrication according to any of the previous aspects of the second exemplary embodiment of the invention, wherein the vinyl ether compound comprises a triethylene glycol divinylether.

An additional aspect of the second exemplary embodiment is a liquid radiation curable composition for additive fabrication according to any of the previous aspects of the second exemplary embodiment of the invention, wherein the cationically curable constituent comprises:
a cycloaliphatic epoxide;
a glycidyl ether epoxide; and
an oxetane.

An additional aspect of the second exemplary embodiment is a liquid radiation curable composition for additive fabrication according to any of the previous aspects of the second exemplary embodiment of the invention, wherein the oxetane is monofunctional and additionally possesses a hydroxyl group.

An additional aspect of the second exemplary embodiment is a liquid radiation curable composition for additive fabrication according to any of the previous aspects of the second exemplary embodiment of the invention, wherein the cycloaliphatic epoxide consists essentially of 3,4-epoxycyclohexylmethyl-3',4'-epoxycyclohexanecarboxylate.

An additional aspect of the second exemplary embodiment is a liquid radiation curable composition for additive fabrication according to any of the previous aspects of the second exemplary embodiment of the invention, wherein the glycidyl ether epoxide component is selected from the group consisting of bisphenol A-based glycidyl ether, a bisphenol S-based glycidyl ether, and a bisphenol F-based glycidyl ether.

An additional aspect of the second exemplary embodiment is a liquid radiation curable composition for additive fabrication according to any of the previous aspects of the second exemplary embodiment of the invention, wherein the cationically curable constituent is substantially free from a vinyl ether compound.

An additional aspect of the second exemplary embodiment is a liquid radiation curable composition for additive fabrication according to any of the previous aspects of the second exemplary embodiment of the invention, wherein the photoinitiating package consists essentially of
  a single onium salt cationic photoinitiator;
  a single reductant possessing a single Norrish Type I photoinitiator dissolved in a single vinyl ether compound that is a liquid at 25 C; and
  optionally, a photosensitizer.

An additional aspect of the second exemplary embodiment is a liquid radiation curable composition for additive fabrication according to any of the previous aspects of the second exemplary embodiment of the invention, wherein the composition consists essentially of
  the photoinitiating package of the preceding claim;
  a single cycloaliphatic epoxide component;
  a single glycidyl ether epoxide component;
  a single oxetane component; and
  one or more free-radically polymerizable compounds;

An additional aspect of the second exemplary embodiment is a liquid radiation curable composition for additive fabrication according to any of the previous aspects of the second exemplary embodiment of the invention, wherein when the liquid radiation curable composition is exposed to UV/vis optics emitting radiation with a peak spectral output at 400 nm and an irradiance at a surface of the liquid radiation curable composition of 2 mW/cm$^2$ for 10 seconds achieves the following:
  a cycloaliphatic epoxide $T_{95}$ value of less than about 100 seconds, more preferably less than about 90 seconds, more preferably less than about 80 seconds, more preferably less than about 70 seconds, more preferably less than about 60 seconds.

An additional aspect of the second exemplary embodiment is a liquid radiation curable composition for additive fabrication according to any of the previous aspects of the second exemplary embodiment of the invention, wherein when the liquid radiation curable composition is exposed to UV/vis optics emitting radiation with a peak spectral output at 400 nm and an irradiance at a surface of the liquid radiation curable composition of 2 mW/cm$^2$ for 10 seconds achieves the following:
  a cycloaliphatic epoxide conversion at 200 seconds of at least about 60%, more preferably at least about 65%, more preferably at least about 70%.

An additional aspect of the second exemplary embodiment is a liquid radiation curable composition for additive fabrication according to any of the previous aspects of the second exemplary embodiment of the invention, wherein when the liquid radiation curable composition is exposed to UV/vis optics emitting radiation with a peak spectral output at 400 nm and an irradiance at a surface of the liquid UV/vis radiation curable composition of 2 mW/cm$^2$ for 10 seconds achieves the following:
  a least squares fit of the initial 12 seconds of the cycloaliphatic epoxide conversion rate of at least about 1.25 s$^{-1}$, more preferably at least about 1.65 s$^{-1}$, more preferably at least about 2.00 s$^{-1}$.

An additional aspect of the second exemplary embodiment is a liquid radiation curable composition for additive fabrication according to any of the previous aspects of the second exemplary embodiment of the invention, wherein when the liquid radiation curable composition is exposed to UV/vis optics emitting radiation with a peak spectral output at 400 nm and an irradiance at a surface of the liquid UV/vis radiation curable composition of 2 mW/cm$^2$ for 10 seconds achieves the following:
  an acrylate conversion at 200 seconds of at least about 95%, more preferably about 100%.

A first aspect of a third additional exemplary embodiment of the invention is a liquid UV/vis radiation curable composition for additive fabrication comprising:
  (a) a photoinitiating package comprising:
    from 0.1 wt. % to 15 wt. % of an iodonium salt cationic photoinitiator,
    from 0.1 wt. % to 5 wt. % of a Norrish Type I photoinitiator;
    from more than 0.5%, preferably more than 1.0%, preferably more than 1.5%, preferably more than 2.5%, preferably more than 3% to 20 wt. %, more preferably 15 wt. %, more preferably 10 wt. %, more preferably 5 wt. % to less than 20 wt. %, more preferably less than 15 wt. %, more preferably less than 10 wt. % of an accelerator;
  (b) a cationically curable constituent comprising
    from 1 wt. % to 20 wt. % of an oxetane;
    from 3 wt. % to 40 wt. % of a cycloaliphatic epoxide; and
    from 2 wt. % to 40 wt. % of a glycidyl ether epoxide;
  (c) from 5 wt. % to about 40 wt. % of a free-radically polymerizable component; and
  (d) optionally up to 50 wt. % of one or more additives;
  wherein all weight percentages are listed relative to the weight of the entire composition.

Another aspect of the third exemplary embodiment is a liquid UV/vis radiation curable composition for additive fabrication according to any of the previous aspects of the third exemplary embodiment of the invention, wherein the accelerator contains a vinyl group.

Another aspect of the third exemplary embodiment is a liquid UV/vis radiation curable composition for additive fabrication according to any of the previous aspects of the third exemplary embodiment of the invention, wherein if the liquid radiation curable composition is exposed to UV/vis optics emitting radiation with a peak spectral output at 400 nm and an irradiance at a surface of the liquid UV/vis radiation curable composition of 2 mW/cm$^2$ for 10 seconds achieves the following:
  a cycloaliphatic epoxide $T_{95}$ value of less than about 100 seconds, more preferably less than about 90 seconds, more preferably less than about 80 seconds, more preferably less than about 70 seconds, more preferably less than about 60 seconds.

Another aspect of the third exemplary embodiment is a liquid UV/vis radiation curable composition for additive fabrication according to any of the previous aspects of the third exemplary embodiment of the invention, wherein if the liquid radiation curable composition is exposed to UV/vis optics emitting radiation with a peak spectral output at 400 nm and an irradiance at a surface of the liquid UV/vis radiation curable composition of 2 mW/cm² for 10 seconds achieves the following:
  a cycloaliphatic epoxide conversion at 200 seconds of at least about 60%, more preferably at least about 65%, more preferably at least about 70%.

Another aspect of the third exemplary embodiment is a liquid UV/vis radiation curable composition for additive fabrication according to any of the previous aspects of the third exemplary embodiment of the invention, wherein if the liquid radiation curable composition is exposed to UV/vis optics emitting radiation with a peak spectral output at 400 nm and an irradiance at a surface of the liquid UV/vis radiation curable composition of 2 mW/cm² for 10 seconds achieves the following:
  a least squares fit of the initial 12 seconds of the cycloaliphatic epoxide conversion rate of at least about 1.25 s⁻¹, more preferably at least about 1.65 s⁻¹, more preferably at least about 2.00 s⁻¹.

Another aspect of the third exemplary embodiment is a liquid UV/vis radiation curable composition for additive fabrication according to any of the previous aspects of the third exemplary embodiment of the invention, wherein if the liquid radiation curable composition is exposed to UV/vis optics emitting radiation with a peak spectral output at 400 nm and an irradiance at a surface of the liquid UV/vis radiation curable composition of 2 mW/cm² for 10 seconds achieves the following:
  an acrylate conversion at 200 seconds of at least about 95%, more preferably about 100%.

Another aspect of the first exemplary embodiment is a radiation curable composition for additive fabrication according to any of the previous aspects of the third exemplary embodiment of the invention, wherein the molar ratio of the iodonium salt cationic photoinitiator to the accelerator is from 2:1 to 1:50, more preferably from 1:1 to 1:30, or from 1:2 to 1:20, or from 1:5 to 1:10.

Another aspect of the first exemplary embodiment is a radiation curable composition for additive fabrication according to any of the previous aspects of the third exemplary embodiment of the invention, wherein the molar ratio of the Norrish Type I photoinitiator to the accelerator is from 2:1 to 1:50, more preferably from 1:1 to 1:30, or from 1:2 to 1:20, or from 1:5 to 1:10.

Another aspect of the first exemplary embodiment is a radiation curable composition for additive fabrication according to any of the previous aspects of the third exemplary embodiment of the invention, wherein the molar ratio of the iodonium salt cationic photoinitiator to the Norrish Type I photoinitiator is from 1:4 to 4:1 more preferably from 1:2 to 2:1, or from 3:4 to 4:3.

Another aspect of the third exemplary embodiment is a liquid UV/vis radiation curable composition for additive fabrication according to any of the previous aspects of the third exemplary embodiment of the invention, wherein the accelerator is a vinyl ether compound.

Another aspect of the third exemplary embodiment is a liquid UV/vis radiation curable composition for additive fabrication according to any of the previous aspects of the third exemplary embodiment of the invention, further comprising a photosensitizer for controlling the penetration depth of the resin.

Another aspect of the third exemplary embodiment is a liquid UV/vis radiation curable composition for additive fabrication according to any of the previous aspects of the third exemplary embodiment of the invention, wherein the photosensitizer for controlling the penetration depth of the resin does not substantially affect the cure speed of the resin.

Another aspect of the third exemplary embodiment is a liquid UV/vis radiation curable composition for additive fabrication according to any of the previous aspects of the third exemplary embodiment of the invention, wherein the iodonium salt is selected from the group consisting of (4-methylphenyl)[4-(2-methylpropyl) phenyl]-, hexafluorophosphate, [4-(1-methylethyl)phenyl](4-methylphenyl)-, tetrakis(pentafluorophenyl)borate(1-), (Bis(4-dodecylphenyl)iodonium hexaflurorantimonate), and (Bis(4-tert-butylphenyl)iodonium hexafluorophosphate).

An additional aspect of the first exemplary embodiment is a radiation curable composition for additive fabrication according to any of the previous aspects of the third exemplary embodiment of the invention, wherein the Norrish Type I photoinitiator is alkyl-, aryl-, or acyl-substituted and comprises a compound which possesses an atom from the Group 14 elements.

Another aspect of the third exemplary embodiment is a liquid UV/vis radiation curable composition for additive fabrication according to any of the previous aspects of the third exemplary embodiment of the invention, wherein Norrish Type I photoinitiator is alkyl-, aryl-, or acyl-substituted and comprises a compound which possesses an atom selected from the group consisting of silicon, germanium, tin, and lead.

Another aspect of the third exemplary embodiment is a liquid UV/vis radiation curable composition for additive fabrication according to any of the previous aspects of the third exemplary embodiment of the invention, wherein the alkyl-, aryl-, or acyl-substituted Norrish Type I photoinitiator is an acylgermanium compound.

Another aspect of the third exemplary embodiment is a liquid UV/vis radiation curable composition for additive fabrication according to any of the previous aspects of the third exemplary embodiment of the invention, wherein the Norrish Type I photoinitiator comprises at least 80%, more preferably at least 90%, more preferably at least 94%, most preferably at least 97% by weight, relative to the entire weight of all Norrish Type I photoinitiators present in the composition, of an acylgermanium compound meeting the following formula (I):

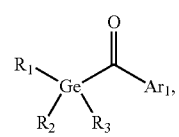

(I)

in which Ar₁ is an aromatic group, either unsubstituted or further substituted in any position by one or more alkyl radicals, ethers, sulfides, silyl groups, halogens, carboxyl groups, vinyl groups, additional aromatic or heterocyclic groups, alkyl radicals, or aromatic or heterocyclic groups interrupted by one or more ether, sulfide, silyl, carboxyl, or vinyl groups, and in which R₁, R₂, and R₃ independently may be an acyl, aryl, alkyl, or carbonyl group, either unsubstituted or further substituted one or more alkyl radicals, ethers, sulfides, silyl groups, halogens, carboxyl groups, vinyl groups, additional aromatic or heterocyclic groups, alkyl radicals, or aromatic or heterocyclic groups interrupted by one or more ether, sulfide, silyl, carboxyl, or vinyl groups.

Another aspect of the third exemplary embodiment is the liquid UV/vis radiation curable composition for additive fabrication according to the previous described aspect of the third exemplary embodiment of the invention, wherein each of $R_1$-$R_3$ is an aryl-substituted or aromatic acyl group; or when exactly two of $R_1$-$R_3$ are an aryl-substituted or aromatic acyl group, the remaining substituted groups are a $C_1$-$C_{10}$, more preferably $C_1$-$C_6$, more preferably $C_1$-$C_3$ alkyl; or when exactly one of $R_1$-$R_3$ is an aryl-substituted or aromatic acyl group, the remaining two substituted groups are a $C_1$-$C_{10}$, more preferably $C_1$-$C_6$, more preferably $C_1$-$C_3$ alkyl; or each of $R_1$-$R_3$ is a $C_1$-$C_{10}$, more preferably $C_1$-$C_6$, more preferably $C_1$-$C_3$ alkyl.

Another aspect of the third exemplary embodiment is a liquid UV/vis radiation curable composition for additive fabrication according to any of the previous aspects of the third exemplary embodiment of the invention, wherein the acylgermanium compound comprises at least 80%, more preferably at least 90%, more preferably at least 94%, most preferably at least 97% by weight, relative to the entire weight of all acylgermanium compounds present in the composition, of one or both of the following compounds:

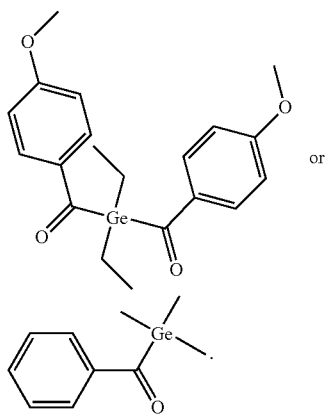

Another aspect of the third exemplary embodiment is a liquid UV/vis radiation curable composition for additive fabrication according to any of the previous aspects of the third exemplary embodiment of the invention, wherein the accelerator is capable of forming a vinyl-based or ether radical, wherein said vinyl-based or ether radical possesses a calculated ionization potential of less than or equal to 6.58 eV, more preferably less than 5.42 eV, less than 4.89 eV, more preferably less than 4.30 eV, most preferably less than 4.20 eV, wherein the ionization potential is calculated in accordance with molecular modeling under B3LYP/6-31G (d) in combination with Koopman's Theorem (IP=$-\varepsilon_{HOMO}$).

Another aspect of the third exemplary embodiment is a liquid UV/vis radiation curable composition for additive fabrication according to any of the previous aspects of the third exemplary embodiment of the invention, wherein the Norrish Type I photoinitiator is configured to create a radical that possesses a rate of addition to the vinyl ether of greater than $10^4$, more preferably greater than 10, most preferably greater than or equal to $3 \times 10^6$.

Another aspect of the third exemplary embodiment is a liquid UV/vis radiation curable composition for additive fabrication according to any of the previous aspects of the third exemplary embodiment of the invention, wherein the composition comprises at least 50%, more preferably at least 60%, more preferably at least 80%, more preferably at least 90%, more preferably at least 95%, relative to the weight of all of the Norrish Type I photoinitiators present in the entire composition, of a Norrish Type I photoinitiator possessing a potential excited triplet state with an ionization potential of less than 4.15 eV, or less than 3.98 eV, or less than 3.90 eV, or less than 3.80 eV, or less than 3.70 eV, or less than 3.55 eV, when the ionization potential is calculated in accordance with molecular modeling B3LYP/6-31G(d) in combination with Koopman's Theorem (IP=$-\varepsilon_{HOMO}$).

Another aspect of the third exemplary embodiment is a liquid UV/vis radiation curable composition for additive fabrication according to any of the previous aspects of the third exemplary embodiment of the invention, wherein the composition comprises at least 50%, more preferably at least 60%, more preferably at least 80%, more preferably at least 90%, more preferably at least 95%, relative to the weight of all of the Norrish Type I photoinitiators present in the entire composition, of a Norrish Type I photoinitiator possessing a potential excited triplet state with an ionization potential of at least 2.5 eV, more preferably at least 3.0 eV, when the ionization potential is calculated in accordance with molecular modeling B3LYP/6-31G(d) in combination with Koopman's Theorem (IP=$-\varepsilon_{HOMO}$).

Another aspect of the third exemplary embodiment is a liquid UV/vis radiation curable composition for additive fabrication according to any of the previous aspects of the third exemplary embodiment of the invention, wherein the composition comprises at least 50%, more preferably at least 60%, more preferably at least 80%, more preferably at least 90%, more preferably at least 95%, relative to the weight of all of the Norrish Type I photoinitiators present in the entire composition, of a Norrish Type I photoinitiator possessing a potential derivative radical with a calculated ionization potential of less than or equal to 5.50 eV, more preferably less than 5.00 eV, more preferably less than 4.80 eV, when the ionization potential is calculated in accordance with molecular modeling B3LYP/6-31G(d) in combination with Koopman's Theorem (IP=$-\varepsilon_{HOMO}$).

A first aspect of a fourth additional exemplary embodiment of the invention is a liquid radiation curable composition for additive fabrication comprising, relative to the weight of the entire composition:
   from 0.1 wt. % to 15 wt. %, or from 0.5 wt. % to about 10 wt. %, or from 1 wt. % to 8 wt. %, or from 2 wt. % to 5 wt. % of an iodonium salt cationic photoinitiator;
   from 0.05 wt. % to 15 wt. %, or from 0.1 wt. % to 10 wt. %, or from 0.5 wt. % to 8 wt. %, or from 1 wt. % to 5 wt. % of a compound according to the following formula (I):

in which $Ar_1$ is an aromatic group, either unsubstituted or further substituted in any position by one or more alkyl radicals, ethers, sulfides, silyl groups, halogens, carboxyl groups, vinyl groups, additional aromatic or heterocyclic groups, alkyl radicals, or aromatic or heterocyclic groups interrupted by one or more ether, sulfide, silyl, carboxyl, or vinyl groups, and in which $R_1$, $R_2$, and $R_3$ independently may be an acyl, aryl, alkyl, or carbonyl group, either unsubstituted or further substituted one or more alkyl radicals, ethers, sulfides, silyl groups, halogens, carboxyl groups, vinyl groups, additional aromatic or heterocyclic groups, alkyl radicals, or aromatic or heterocyclic groups interrupted by one or more ether, sulfide, silyl, carboxyl, or vinyl groups;

from 0.5 wt. % to 20 wt. %, or from 1.0 wt. % to 20 wt. %, or from 1.5 wt. % to 15 wt. %, or from 2 wt. % to 15 wt. %, or from 2.5 wt. % to 15 wt. %, or from 2.5 wt. % to 10 wt. %, or about 3 wt. % of a vinyl ether;

optionally, from 3 wt. % to 30 wt. %, or from 3 wt. % to 25 wt. %, or from 5 wt. % to 20 wt. %, of an oxetane;

optionally, from 1 wt. % to 45 wt. %, or from 3 wt. % to 35 wt. %, or from 5 wt. % to 25 wt. %, of a cycloaliphatic epoxide;

from 2 wt. % to 50 wt. %, or from 3 wt. % to 40 wt. %, or from 5 wt. % to 30 wt. % of a glycidyl ether epoxide;

from 5 wt. % to about 60 wt. %, or from 10 wt. % to about 50 wt. %, or from 15 wt. % to 40 wt. %, of a free-radically polymerizable component; and optionally, up to 50 wt. % of one or more additives.

Another aspect of the fourth exemplary embodiment of the invention is a liquid radiation curable composition for additive fabrication according to any of the previous aspects of the fourth exemplary embodiment of the invention, wherein when the compound according to formula (I) forms an excited triplet state upon sufficient excitation by actinic radiation, said excited triple state exhibits an ionization potential of less than 4.15 eV, more preferably less than 3.98 eV, more preferably less than 3.90 eV, more preferably less than 3.80 eV, more preferably less than 3.70 eV, more preferably less than 3.55 eV if calculated in accordance with molecular modeling under B3LYP/6-31G(d) in combination with Koopman's Theorem (IP=$-\varepsilon_{HOMO}$).

Another aspect of the fourth exemplary embodiment of the invention is a liquid radiation curable composition for additive fabrication according to any of the previous aspects of the fourth exemplary embodiment of the invention, wherein when the compound according to formula (I) forms an excited triplet state upon sufficient excitation by actinic radiation, said excited triple state exhibits an ionization potential of at least 2.5 eV, more preferably at least 3.0 eV if calculated in accordance with molecular modeling under B3LYP/6-31G(d) in combination with Koopman's Theorem (IP=$-\varepsilon_{HOMO}$).

Another aspect of the fourth exemplary embodiment of the invention is a liquid radiation curable composition for additive fabrication according to any of the previous aspects of the fourth exemplary embodiment of the invention, wherein the compound according to formula (I) is capable of forming a radical with a calculated ionization potential of less than or equal to 5.50 eV, more preferably less than 5.00 eV, more preferably less than 4.80 eV, if calculated in accordance with molecular modeling under B3LYP/6-31G(d) in combination with Koopman's Theorem (IP=$-\varepsilon_{HOMO}$).

Another aspect of the fourth exemplary embodiment of the invention is a liquid radiation curable composition for additive fabrication according to any of the previous aspects of the fourth exemplary embodiment of the invention, wherein the compound according to formula (I) is capable of forming a radical with a calculated ionization potential of greater than 4.05 eV, if calculated by molecular modeling under B3LYP/6-31G(d) in combination with Koopman's Theorem (IP=$-\varepsilon_{HOMO}$).

Another aspect of the fourth exemplary embodiment of the invention is a liquid radiation curable composition for additive fabrication according to any of the previous aspects of the fourth exemplary embodiment of the invention, further comprising from 0.01 wt. % to about 10 wt. %, more preferably from 0.25 wt. % to about 5 wt. %, more preferably from about 0.5 wt. % to 3 wt. % of a 1-chloro-4-propoxythioxanthone or 9,10-Diethoxyanthracene.

Another aspect of the fourth exemplary embodiment of the invention is a liquid radiation curable composition for additive fabrication according to any of the previous aspects of the fourth exemplary embodiment of the invention, wherein the cycloaliphatic epoxide and oxetane are not optional.

Another aspect of the fourth exemplary embodiment of the invention is a liquid radiation curable composition for additive fabrication according to any of the previous aspects of the fourth exemplary embodiment of the invention, wherein the vinyl ether is capable of producing a radical having a calculated ionization potential of less than or equal to 6.58 eV, more preferably less than 5.42 eV, less than 4.89 eV, more preferably less than 4.30 eV, most preferably less than 4.20 eV, if calculated by molecular modeling under B3LYP/6-31G(d) in combination with Koopman's Theorem (IP=$-\varepsilon_{HOMO}$).

Another aspect of the fourth exemplary embodiment of the invention is a liquid radiation curable composition for additive fabrication according to any of the previous aspects of the fourth exemplary embodiment of the invention, wherein the compound according to formula (I) is capable of producing a radical that possesses a rate of addition to the vinyl ether component of greater than or equal to $10^4$ $M^{-1}$ $s^{-1}$, more preferably greater than or equal to about $10^5$ $M^{-1}$ $s^{-1}$, most preferably greater than or equal to about $3\times10^5$ $M^{-1}$ $s^{-1}$.

Another aspect of the fourth exemplary embodiment of the invention is a liquid radiation curable composition for additive fabrication according to any of the previous aspects of the fourth exemplary embodiment of the invention, wherein the additives are not optional and comprise a filler or polyol.

Another aspect of the fourth exemplary embodiment of the invention is a liquid radiation curable composition for additive fabrication according to any of the previous aspects of the fourth exemplary embodiment of the invention, wherein if the liquid radiation curable composition is exposed to UV/vis optics emitting radiation with a peak spectral output at 400 nm and an irradiance at a surface of the liquid UV/vis radiation curable composition of 2 mW/cm$^2$ for 10 seconds achieves the following:

a cycloaliphatic epoxide $T_{595}$ value of less than about 100 seconds, more preferably less than about 90 seconds, more preferably less than about 80 seconds, more preferably less than about 70 seconds, more preferably less than about 60 seconds.

Another aspect of the fourth exemplary embodiment of the invention is a liquid radiation curable composition for additive fabrication according to any of the previous aspects of the fourth exemplary embodiment of the invention, wherein if the liquid radiation curable composition is exposed to UV/vis optics emitting radiation with a peak spectral output at 400 nm and an irradiance at a surface of the liquid UV/vis radiation curable composition of 2 mW/cm$^2$ for 10 seconds achieves the following:

a cycloaliphatic epoxide conversion at 200 seconds of at least about 60%, more preferably at least about 65%, more preferably at least about 70%.

Another aspect of the fourth exemplary embodiment of the invention is a liquid radiation curable composition for additive fabrication according to any of the previous aspects of the fourth exemplary embodiment of the invention, wherein if the liquid radiation curable composition is exposed to UV/vis optics emitting radiation with a peak spectral output at 400 nm and an irradiance at a surface of the liquid UV/vis radiation curable composition of 2 mW/cm$^2$ for 10 seconds achieves the following:

a least squares fit of the initial 12 seconds of the cycloaliphatic epoxide conversion rate of at least about 1.25 s$^{-1}$, more preferably at least about 1.65 s$^{-1}$, more preferably at least about 2.00 s$^{-1}$.

Another aspect of the fourth exemplary embodiment of the invention is a liquid radiation curable composition for additive fabrication according to any of the previous aspects of the fourth exemplary embodiment of the invention, wherein if the liquid radiation curable composition is exposed to UV/vis optics emitting radiation with a peak spectral output at 400 nm and an irradiance at a surface of the liquid UV/vis radiation curable composition of 2 mW/cm$^2$ for 10 seconds achieves the following:

an acrylate conversion at 200 seconds of at least about 95%, more preferably about 100/o.

A first aspect of a fifth additional exemplary embodiment of the present invention is a method of forming a three-dimensional article via an additive fabrication system utilizing UV/vis optics, the method comprising:

(1) providing the liquid radiation curable composition for additive fabrication of any of the preceding aspects of any of the preceding exemplary embodiments;
(2) establishing a first liquid layer of the liquid radiation curable resin;
(3) exposing the first liquid layer imagewise to actinic radiation via a UV/vis optics configuration to form an imaged cross-section, thereby forming a first cured layer;
(4) forming a new layer of liquid radiation curable resin in contact with the first cured layer;
(5) exposing said new layer imagewise to actinic radiation to form an additional imaged cross-section; and
(6) repeating steps (4) and (5) a sufficient number of times in order to build up a three-dimensional article;
wherein the UV/vis optics emit radiation at a peak spectral intensity from about 375 nm to about 500 nm, more preferably from about 380 nm to about 450 nm, more preferably from about 390 nm to about 425 nm, more preferably from about 395 nm to about 410 nm.

Another aspect of the fifth exemplary embodiment of the present invention is the method of forming a three-dimensional article via an additive fabrication system utilizing UV/vis optics of the preceding aspect of the fifth exemplary embodiment of the invention, wherein the UV/vis optics configuration is selected from one or more of the group consisting of LED/DLP, laser/DLP, LED/LCD, and laser/LCD.

Another aspect of the fifth exemplary embodiment of the present invention is a three-dimensional part formed by the process of any of the preceding aspects of the fifth exemplary embodiment of the invention using the liquid radiation curable composition of any of the aspects of any of the first through the fourth exemplary embodiments of the present invention.

Unless otherwise specified, the term wt. % means the amount by mass of a particular constituent relative to the entire liquid radiation curable composition for additive fabrication into which it is incorporated.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventor for carrying out the invention. Variations of those preferred embodiments may become apparent to those of ordinary skill in the art upon reading the foregoing description. The inventor expects skilled artisans to employ such variations as appropriate, and the inventor intends for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

While the invention has been described in detail and with reference to specific embodiments thereof, it will be apparent to one of ordinary skill in the art that various changes and modifications can be made therein without departing from the spirit and scope of the claimed invention.

What is claimed is:

1. A radiation curable composition for additive fabrication comprising:
a Norrish Type I photoinitiator;
a cationic photoinitiator;
a free-radically polymerizable constituent;
a cationically polymerizable constituent;
a compound possessing an electron-donating substituent attached to a vinyl group; and
optionally, one or more additives;
wherein the compound possessing an electron-donating substituent attached to a vinyl group comprises a vinyl ether compound;
wherein the Norrish Type I photoinitiator possesses a potential excited triplet state with an ionization potential from 2.5 eV to 4.15 eV, wherein the ionization potential is calculated in accordance with molecular modeling B3LYP/6-31G(d) in combination with Koopman's Theorem (IP=-$\varepsilon_{HOMO}$).

2. The radiation curable composition for additive fabrication according to claim 1, wherein the Norrish Type I photoinitiator possesses a potential excited triplet state with an ionization potential from 3.0 eV to 3.90 eV, wherein the ionization potential is calculated in accordance with molecular modeling B3LYP/6-31G(d) in combination with Koopman's Theorem (IP=-$\varepsilon_{HOMO}$).

3. The radiation curable composition for additive fabrication according to claim 1, wherein the molar ratio of the cationic photoinitiator to the compound possessing an electron-donating substituent attached to a vinyl group is from 1:1 to 1:30, the molar ratio of the Norrish Type I photoinitiator to the compound possessing an electron-donating substituent attached to a vinyl group is from 2:1 to 1:50, and the molar ratio of the cationic photoinitiator to the Norrish Type I photoinitiator is from 1:4 to 4:1.

4. The radiation curable composition for additive fabrication according to claim 1, wherein the cationic photoinitiator comprises an iodonium salt.

5. The radiation curable composition for additive fabrication according to claim 4, wherein the cationically polymerizable constituent comprises an oxetane compound and a cycloaliphatic epoxide compound.

6. The radiation curable composition for additive fabrication according to claim 2, wherein
the Norrish Type I photoinitiator is present from 0.1 wt. % to 8 wt. %;
the cationic photoinitiator is present from 0.1 wt. % to 15 wt. %;
the free-radically polymerizable constituent is present from 5 wt. % to 40 wt. %;
the cationically polymerizable constituent is present from 5 wt. % to 80 wt. %;
the compound possessing an electron-donating substituent attached to a vinyl group is present from 0.1 wt. % to 15 wt. %; and
the additives are present from 0 wt. % to 50 wt. %;
wherein all weight percentages are listed relative to the weight of the entire composition.

7. The radiation curable composition for additive fabrication according to claim 6, wherein the Norrish Type photoinitiator comprises an alkyl-, aryl-, or acyl-substituted compound which further comprises a silicon, germanium, tin, or lead atom.

8. The radiation curable composition for additive fabrication according to claim 7, wherein the Norrish Type I photoinitiator comprises a compound according to the following formula (I):

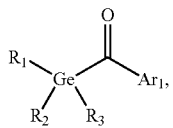

in which Ar$_1$ is an aromatic group, either unsubstituted or further substituted in any position by one or more alkyl radicals, ethers, sulfides, silyl groups, halogens, carboxyl groups, vinyl groups, additional aromatic or heterocyclic groups, alkyl radicals, or aromatic or heterocyclic groups interrupted by one or more ether, sulfide, silyl, carboxyl, or vinyl groups, and in which R$_1$, R$_2$, and R$_3$ independently may be an acyl, aryl, alkyl, or carbonyl group, either unsubstituted or further substituted with one or more alkyl radicals, ethers, sulfides, silyl groups, halogens, carboxyl groups, vinyl groups, additional aromatic or heterocyclic groups, alkyl radicals, or aromatic or heterocyclic groups interrupted by one or more ether, sulfide, silyl, carboxyl, or vinyl groups.

9. The radiation curable composition for additive fabrication according to claim 8, wherein one of the following conditions is satisfied:
(a) each of R$_1$-R$_3$ is an aryl-substituted or aromatic acyl group;

(b) if exactly two of R$_1$-R$_3$ are an aryl-substituted or aromatic acyl group, the remaining substituted groups are a C$_1$-C$_{10}$ alkyl;
(c) if exactly one of R$_1$-R$_3$ is an aryl-substituted or aromatic acyl group, the remaining two substituted groups are a C$_1$-C$_{10}$ alkyl; or
(d) each of R$_1$-R$_3$ is a C$_1$-C$_{10}$ alkyl.

10. A radiation curable composition for additive fabrication according to claim 9, wherein the cationic photoinitiator comprises (4-methylphenyl)[4-(2-methylpropyl) phenyl]-, hexafluorophosphate, [4-(1-methylethyl)phenyl](4-methylphenyl)-, tetrakis(pentafluorophenyl)borate(1-), (bis(4-dodecylphenyl)iodonium hexaflurorantimonate), or (bis(4-tert-butylphenyl)iodonium hexafluorophosphate).

11. A radiation curable composition for additive fabrication comprising:
an iodonium salt cationic photoinitiator;
a Norrish Type I photoinitiator;
a compound possessing an electron-donating substituent attached to a vinyl group;
a cationically polymerizable constituent;
a free-radically polymerizable constituent; and
optionally, one or more additives;
wherein said compound possessing an electron-donating substituent attached to a vinyl group is capable of forming a vinyl-based or ether radical, wherein said vinyl-based or ether radical possesses a calculated ionization potential from about 3.3 eV to about 4.89 eV when the ionization potential is calculated in accordance with molecular modeling under B3LYP/6-31G(d) in combination with Koopman's Theorem (IP=-ε$_{HOMO}$);
wherein the Norrish Type I photoinitiator possesses a potential excited triplet state with an ionization potential that is less than 3.90 eV, wherein the ionization potential is calculated in accordance with molecular modeling under B3LYP/6-31G(d) in combination with Koopman's Theorem (IP=-ε$_{HOMO}$).

12. The radiation curable composition for additive fabrication according to claim 11, wherein the Norrish Type I photoinitiator possesses a potential excited triplet state with an ionization potential from about 3.0 eV to about 3.80 eV, wherein the ionization potential is calculated in accordance with molecular modeling B3LYP/6-31G(d) in combination with Koopman's Theorem (IP=-ε$_{HOMO}$).

13. The radiation curable composition for additive fabrication according to claim 12, wherein the Norrish Type I photoinitiator possesses a potential excited triplet state with an ionization potential from about 3.0 eV to about 3.55 eV, wherein the ionization potential is calculated in accordance with molecular modeling under B3LYP/6-31G(d) in combination with Koopman's Theorem (IP=-ε$_{HOMO}$).

14. The radiation curable composition for additive fabrication according to claim 11, wherein the calculated ionization potential of the vinyl-based or ether radical is from about 3.80 eV to about 4.20 eV when the ionization potential is calculated in accordance with molecular modeling under B3LYP/6-31G(d) in combination with Koopman's Theorem (IP=-ε$_{HOMO}$).

15. The radiation curable composition for additive fabrication according to claim 14, wherein the Norrish Type I photoinitiator is configured to create a radical that possesses a rate of addition to the vinyl ether greater than or equal to about 10$^5$ M$^{-1}$s$^{-1}$.

16. The radiation curable composition for additive fabrication according to claim 15, wherein the Norrish Type I photoinitiator is configured to create a radical that possesses a rate of addition to the vinyl ether compound of greater than about $3 \times 10^6$ $M^{-1}s^{-1}$.

17. The radiation curable composition for additive fabrication according to claim 16, wherein the cationically polymerizable constituent comprises a cycloaliphatic epoxide compound, a glycidyl ether compound, and an oxetane compound.

18. The radiation curable composition for additive fabrication according to claim 17, wherein, relative to the weight of the entire composition,
- the iodonium salt cationic photoinitiator is present from about 0.1 wt. % to about 15 wt. %;
- the Norrish Type I photoinitiator is present from about 0.1 wt. % to about 8 wt. %;
- the compound possessing an electron-donating substituent attached to a vinyl group is present from about 0.1 wt. % to about 15 wt. %;
- the cationically polymerizable constituent is present from about 5 wt. % to about 80 wt. %; and
- the free-radically polymerizable constituent is present from about 5 wt. % to about 40 wt. %.

19. The radiation curable composition for additive fabrication according to claim 6, wherein the Norrish Type I photoinitiator possesses a potential excited triplet state with an ionization potential that is less than 3.70 eV.

20. The radiation curable composition for additive fabrication according to claim 1, wherein the Norrish Type I photoinitiator possesses a potential excited triplet state with an ionization potential that is less than 155 eV.

* * * * *